(12) United States Patent
Yu et al.

(10) Patent No.: US 11,557,546 B2
(45) Date of Patent: *Jan. 17, 2023

(54) SEMICONDUCTOR STRUCTURE

(71) Applicant: TAIWAN SEMICONDUCTOR MANUFACTURING COMPANY LTD., Hsinchu (TW)

(72) Inventors: Chen-Hua Yu, Hsinchu (TW); Kuo-Chung Yee, Taoyuan County (TW); Jui-Pin Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/327,417

(22) Filed: May 21, 2021

(65) Prior Publication Data

US 2021/0280528 A1 Sep. 9, 2021

Related U.S. Application Data

(60) Continuation of application No. 16/852,124, filed on Apr. 17, 2020, now Pat. No. 11,018,095, which is a
(Continued)

(51) Int. Cl.
*H01L 23/552* (2006.01)
*H01L 23/31* (2006.01)
*H01L 21/56* (2006.01)
*H01L 21/3105* (2006.01)
*H01L 21/768* (2006.01)
(Continued)

(52) U.S. Cl.
CPC ...... *H01L 23/552* (2013.01); *H01L 21/31053* (2013.01); *H01L 21/565* (2013.01); *H01L 21/568* (2013.01); *H01L 21/768* (2013.01); *H01L 23/3107* (2013.01); *H01L 23/5389* (2013.01); *H01L 24/19* (2013.01); *H01L 24/20* (2013.01); *H01L 24/96* (2013.01); *H01L 24/97* (2013.01); *H01L 2224/04105* (2013.01)

(58) Field of Classification Search
CPC ............... H01L 23/552; H01L 23/3107; H01L 23/5389; H01L 21/565; H01L 21/568; H01L 21/768
See application file for complete search history.

(56) References Cited

U.S. PATENT DOCUMENTS 5,353,498 A * 10/1994 Fillion .................. H01L 23/293
257/E23.092
6,207,550 B1 * 3/2001 Hase ....................... H01L 24/29
257/E23.068
(Continued)

*Primary Examiner* — Tuan A Hoang
(74) *Attorney, Agent, or Firm* — WPAT; Anthony King

(57) ABSTRACT

A semiconductor structure includes a molding, a device in the molding, and a RDL over the device and the molding. The RDL includes a first portion directly over a surface of the molding, and a second portion directly over a surface of the device. A bottom surface of the first portion is in contact with the surface of the molding, and a bottom surface of the second portion is in contact with the surface of the device. The bottom surface of the first portion of the RDL and the bottom surface of the second portion of the RDL are at different levels and misaligned from each other. A thickness of the first portion is greater than a thickness of the second portion.

20 Claims, 24 Drawing Sheets

Related U.S. Application Data continuation of application No. 16/042,275, filed on Jul. 23, 2018, now Pat. No. 10,629,541, which is a division of application No. 14/632,371, filed on Feb. 26, 2015, now Pat. No. 10,032,725.

(51) Int. Cl.
*H01L 23/538* (2006.01)
*H01L 23/00* (2006.01)

(56) References Cited

U.S. PATENT DOCUMENTS

| | | | |
|---|---|---|---|
| 8,786,103 B2 * | 7/2014 | Uchiyama | H01L 25/0657 |
| | | | 257/E23.174 |
| 2007/0246825 A1 * | 10/2007 | Oh | H01L 25/165 |
| | | | 257/E23.125 |
| 2008/0108168 A1 * | 5/2008 | Yang | H01L 27/14687 |
| | | | 257/E21.001 |

* cited by examiner

SEMICONDUCTOR STRUCTURE

CROSS-REFERENCE TO RELATED APPLICATIONS

This application is a continuation application of U.S. patent application Ser. No. 16/852,124, filed Apr. 17, 2020, which is a continuation application of U.S. patent application Ser. No. 16/042,275, filed Jul. 23, 2018, which is a divisional application of U.S. patent application Ser. No. 14/632,371 filed Feb. 26, 2015, the entire disclosure of which is hereby incorporated by reference.

BACKGROUND

Electronic equipment using semiconductor devices are essential for many modern applications. The semiconductor devices are applied for a variety of high-density electronics applications. With the advancement of electronic technology, the electronic equipment is getting more complicated with greater functionality and greater amounts of integrated circuitry, while are becoming increasingly smaller in size. Due to the miniaturized scale of the electronic equipment, various types and dimensions of semiconductor devices performing different functionalities are integrated and packaged into a single module. Furthermore, numerous manufacturing operations are implemented for integration of various types of semiconductor devices.

However, the manufacturing and integration of the semiconductor devices involve many complicated steps and operations. The integration of the semiconductor devices in such low profile and high density becomes more complicated. An increase in a complexity of manufacturing and integration of the semiconductor devices may cause deficiencies such as contamination, poor electrical interconnection, development of cracks, delamination of the components or high yield loss.

The semiconductor devices are integrated and produced in an undesired configuration, which would further exacerbate materials wastage and thus increase the manufacturing cost. Since more different components with different materials are involved, complexity of the manufacturing and integration operations of the semiconductor devices is increased. There are more challenges to modify a structure of the semiconductor device and improve the manufacturing operations. As such, there is a continuous need to improve the manufacturing the semiconductor devices and solve the above deficiencies.

BRIEF DESCRIPTION OF TILE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
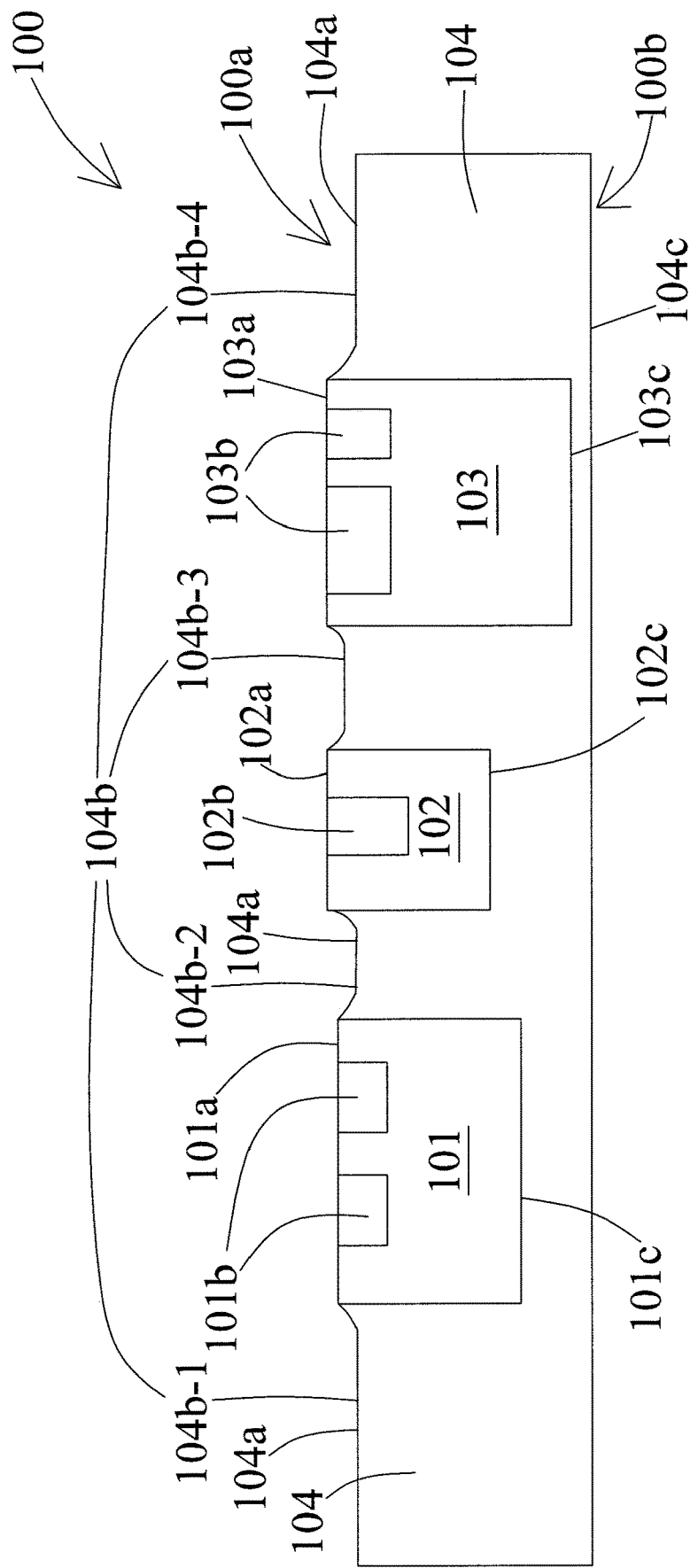
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and max also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment including various semiconductor devices is manufactured by a number of operations. During the manufacturing, the semiconductor devices with different functionalities and dimensions are integrated into a single system. Circuitries of the semiconductor devices are integrated and connected through conductive traces and a substrate. After integration of the semiconductor devices, the semiconductor devices are encapsulated by a mold in order to protect the semiconductor devices from damages of the circuitries and environmental contamination. However, the encapsulation of the semiconductor devices could not provide sufficient protection to the semiconductor devices involving different dimensions and materials. The contamination of the semiconductor devices and delamination of components are suffered.

Further, the semiconductor devices may include some radio frequency (RF) components which require isolation from external electromagnetic interference. Also, the semiconductor device with RF components has to prevent a leakage of RF signals generated by the RF components out of the semiconductor device. A shielding is provided for isolating the semiconductor devices and preventing external interference and signal leakage. However, the semiconductor devices with the shielding could not be encapsulated in a desired configuration, as the shielding would affect a formation of the encapsulation. As a result, the semiconductor devices could not receive optimal physical protection from the encapsulation and the isolation from external electromagnetic interference by the shielding.

In the present disclosure, an improved semiconductor structure is disclosed. The semiconductor structure includes several devices and a metallic shield configured to isolate the devices from each other and external electromagnetic interference. At least one of the devices has different height or thickness from another one of the devices. The devices are supported by a molding formed by immersion molding operations. The devices are dipped into a mold chase containing molding compound, and then the molding is formed around and interposed between the devices. The devices are supported by the molding, as such a carrier or a substrate for supporting the devices are not required for integration of the devices, and thus material cost could be saved.

Furthermore, a metallic shield is included in the semiconductor structure for isolating the devices. The profile of the metallic shield would obstruct filling of molding compound during transfer molding operations or compression molding operations. As a result, a molding encapsulating the devices and the metallic shield could not be formed in a desired configuration by transfer molding operations or compression molding operations. In the present disclosure, the molding formed by the immersion molding operations would not be affected by profiles of the devices and the metallic shield, and thus the devices could be fully embedded by the molding, while the metallic shield could provide isolation to each device from electromagnetic interference.

In addition, during manufacturing operations of the semiconductor structure, a sacrificial layer is disposed on an active side of at least one of the devices before attaching the devices on a carrier. The sacrificial layer is configured to cover active components such as die pads on the at least one of the devices during formation of the molding. When the sacrificial layer is then removed after the formation of the molding, the devices are disposed at a substantially same level as each other. Therefore, some operations such as grinding on the active side, disposition of pillars or bumps on the die pads, etc. could be omitted to save manufacturing cost.

FIG. 1 is an embodiment of a semiconductor structure 100. The semiconductor structure 100 includes several devices (101, 102, 103) and a molding 104. Although only three devices (101, 102, 103) are described below and are illustrated in figures, it is not intended to limit to three devices. Any number of devices is also fallen into our intended scope, without departing from the spirit and scope of the present disclosure.

In some embodiments, the devices (101, 102, 103) are integrated or packaged to become the semiconductor structure 100. In some embodiments, the semiconductor structure 100 is a system in package (SiP). The devices (101, 102, 103) are electrically connected. In some embodiments, the devices (101, 102, 103) include RF components and are integrated to become a radio frequency (RF) package.

In some embodiments, the semiconductor structure 100 includes a front side 100a and a back side 100b opposite to the front side 100a. In some embodiments, the front side 100a is processed for routing circuitry within the semiconductor structure 100. In some embodiments, the back side 100b does not involve the routing of the circuitry within the semiconductor structure 100.

In some embodiments, the devices (101, 102, 103) are horizontally disposed or vertically stacked. In some embodiments, the devices (101, 102, 103) involve different functionalities from each other. For example, the devices (101, 102, 103) include a processor, a flash memory, a resistor, a capacitor, etc. In some embodiments, the devices include at least one unpackaged device and at least one packaged device. In some embodiments, the device 101 is the unpackaged device such as a die or a chip. In some embodiments, the devices 102 and 103 are packaged devices.

In some embodiments, the devices (101, 102, 103) include a bare chip, a die, a ball grid array (BGA) package, a quad flat no leads (QFN) package, a land grid array (LGA) package, a surface mount device (SMD), a microelectromechanical systems device (MEMS), etc. In some embodiments, the device 101 is the chip, the device 102 is the SMD, and the device 103 is the BGA, QFN or LGA package. In some embodiments, the device 101 is the chip which is a small piece including semiconductor materials such as silicon and is fabricated with a predetermined functional circuit therein produced by photolithography operations. In some embodiments, the device 101 is singulated from a silicon wafer by a mechanical or laser blade. In some embodiments, the device 101 is in a quadrilateral, a rectangular or a square shape.

In some embodiments, the devices (101, 102, 103) have different dimensions from each other. In some embodiments, at least one of the devices (101, 102, 103) has substantially different height from another one of the devices (101, 102, 103). In some embodiment, the device 101 has substantially smaller height than a height of the device 102 or a height of the device 103.

In some embodiments, each of the devices (101, 102, 103) includes a first surface (101a, 102a, 103a). Each of the first surfaces (101a, 102a, 103a) is disposed with several active components such as die pads, I/O pads, bond pads, conductive traces, conductive structures etc. In some embodiments, the first surface 101a of the device 101 is disposed with several die pads 101b. The first surface 102a of the device 102 is disposed with several conductive structures 102b. The first surface 103a of the device 103 is disposed with several conductive structures 103b. In some embodiments, the first surfaces (101a, 102a, 103a) are active surfaces of the devices (101, 102, 103) respectively. Each active surface of the devices (101, 102, 103) includes an active component.

In some embodiments, the die pads 101b are disposed on the first surface 101a of the device 101. In some embodiments, the die pad 101b is configured to electrically connect with a circuitry external to the device 101, so that a circuitry internal to the device 101 electrically connects with the circuitry external to the device 101 through the die pad 101b. In some embodiments, the die pad 101b includes gold, silver, copper, nickel, tungsten, aluminum, palladium and/or alloys thereof.

In some embodiments, each of the devices (101, 102, 103) includes a second surface (101c, 102c, 103c) which is opposite to the corresponding first surface (101a, 102a, 103a). In some embodiments, the second surfaces (101c, 102c, 103c) are back sides of the devices (101, 102, 103) respectively. Each back side of the devices (101, 102, 103) does not include active component.

In some embodiments, the molding 104 is disposed between the devices (101, 102, 103) and surrounds the devices (101, 102, 103). Sidewalls of the devices (101, 102, 103) are interfaced with the molding 104. In some embodiments, the devices (101, 102, 103) are horizontally arranged and supported by the molding 104.

In some embodiments, the molding 104 includes a molding compound. The molding compound can be a single layer film or a composite stack. The molding compound includes various materials, for example, one or more of epoxy resins, phenolic hardeners, silicas, catalysts, pigments, mold release agents, and the like. Each of the materials for forming a molding compound has a high thermal conductivity, a low moisture absorption rate, a high flexural strength at board-mounting temperatures, or a combination of these.

In some embodiments, the molding 104 includes a first surface 104a. In some embodiments, the first surface 104a includes a recessed portion 104b recessed from one of the first surfaces (101a, 102a, 103a) of the devices (101, 102, 103). In some embodiments, the recessed portion 104b surrounds the device 101. In some embodiments, the recessed portion 104b is disposed between the devices (101, 102, 103).

In some embodiments, a level of the recessed portion 104b of the molding 104 is substantially lower than a level of the one of the first surfaces (101a, 102a, 103a) of the devices (101, 102, 103). In some embodiments, the recessed portion 104b of the molding 104 is substantially greater than about 5 µm recessed from the one of the first surfaces (101a, 102a, 103a) of the devices (101, 102, 103). In some embodiments, the recessed portion 104b adjacent to a peripheral of one of the devices (101, 102, 103) is in a curved or a stepped configuration.

In some embodiments, the recessed portion 104b is about 3 µm to about 50 µm recessed from the one of the first surfaces (101a, 102a, 103a) of the devices (101, 102, 103). In some embodiments, the recessed portion 104b is about 5 µm to about 15 µm recessed from the one of the first surfaces (101a, 102a, 103a) of the devices (101, 102, 103).

In some embodiments, the recessed portion 104b disposed adjacent to the device 101 is recessed from the first surface 101a of the device 101. In some embodiments, the recessed portion 104b disposed adjacent to the device 101 is substantially greater than about 5 µm recessed from the first surface 101a of the device 101. In some embodiments, the recessed portion 104b disposed adjacent to the device 101 is about 3 µm to about 20 µm recessed from the first surface 101a of the device 101.

In some embodiments, the recessed portion 104b includes several sections (104b-1, 104b-2, 104b-3, 104b-4) recessed from one of the devices (101, 102, 103) and disposed at levels different from each other. For example, a section 104b-3 is at a level different from another section 104b-1. In some embodiments, the sections (104b-1, 104b-2, 104b-3, 104b-4) are disposed at substantially same level as each other. In some embodiments, a vertical distance between the section (104b-1 or 104b-2) surrounding the device 101 and the first surface 101a of the device 101 is substantially smaller than or equal to a vertical distance between the section (104-3 or 104b-4) surrounding the device (102 or 103) and the first surface (102a or 103a) of the device (102 or 103).

Figure 2:
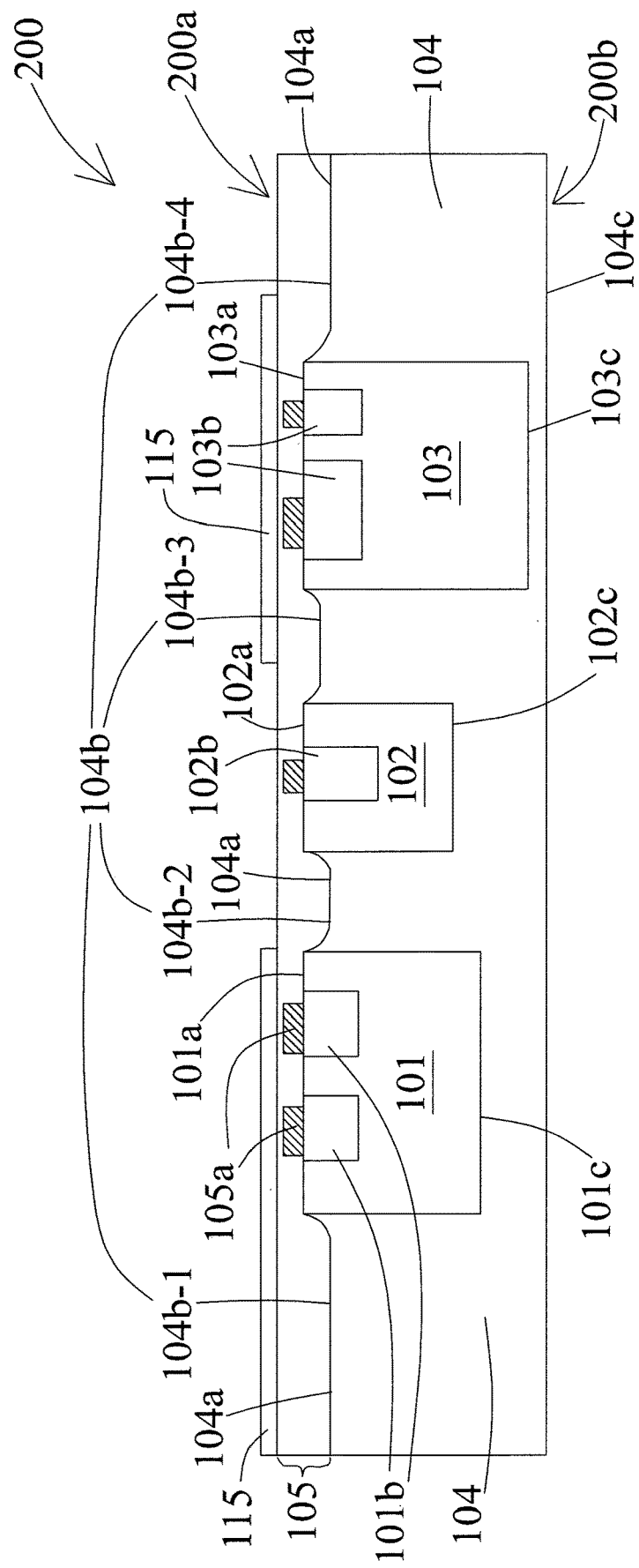
FIG. 2 is a schematic view of a semiconductor structure in accordance with some embodiments of the present disclosure.

FIG. 2 is an embodiment of a semiconductor structure 200. The semiconductor structure 200 includes several devices (101, 102, 103) and a molding 104 which have similar configurations as in FIG. 1. In some embodiments, the devices (101, 102, 103) are integrated or packaged to become the semiconductor structure 200. In some embodiments, the semiconductor structure 200 is a system in package (SiP). In some embodiments, the devices (101, 102, 103) include RF components and are integrated to become a radio frequency (RF) package.

In some embodiments, a redistribution layer (RDL) 105 is disposed over the devices (101, 102, 103) and the molding 104. In some embodiments, a redistribution layer (RDL) 105 is disposed over first surfaces (101a, 102a, 103a) of the devices (101, 102, 103) and a first surface 104a of the molding 104. In some embodiments, the RDL 105 is an electrical connection to and/or between the devices (101, 102, 103) and circuitry external to the devices (101, 102, 103). The RDL 105 re-routes a path of a circuit from a die pad 101b or conductive structures 102b, 103b to the circuitry external to the devices (101, 102, 103). In some embodiments, the RDL 105 is a post passivation interconnect (PPI) which is a conductive interconnect structure on a passivation layer disposed over the first surfaces (101a, 102a, 103a) of the devices (101, 102, 103). In some embodiments, a bond pad 115 is disposed over and electrically connected to the RDL 105. In some embodiments, the bond pad 115 is a land grid array (LGA) pad configured to be mounted on a print circuit board (PCB). In some embodiments, the bond pad 115 is a ball grid array (BGA) pad configured to receive a conductive bump.

In some embodiments, the conductive interconnect structure includes material such as gold, silver, copper, nickel, tungsten, aluminum, and/or alloys thereof. In some embodiments, the conductive interconnect structure includes a seed layer and a metal layer which are disposed in a sequence. In some embodiments, the conductive interconnect structure of the RDL 105 interconnects the active components disposed on the first surfaces (101a, 102a, 103a) of the devices (101, 102, 103). In some embodiments, the RDL 105 integrates the circuitries of the devices (101, 102, 103).

In some embodiments, the RDL 105 is disposed over the first surfaces (101a, 102a, 103a) of the devices (101, 102, 103) and the first surface 104a of the molding 104. The RDL 105 includes a conductive interconnect structure 105a contacted with the die pad 101b of the device 101. In some embodiments, the conductive interconnect structure 105a of the RDL 105 is directly contacted with the die pad 101b of the device 101. A conductive pillar or bump is not included. The conductive pillar or bump does not form or dispose over the die pad 101b and thus manufacturing cost could be saved.

Figure 3:
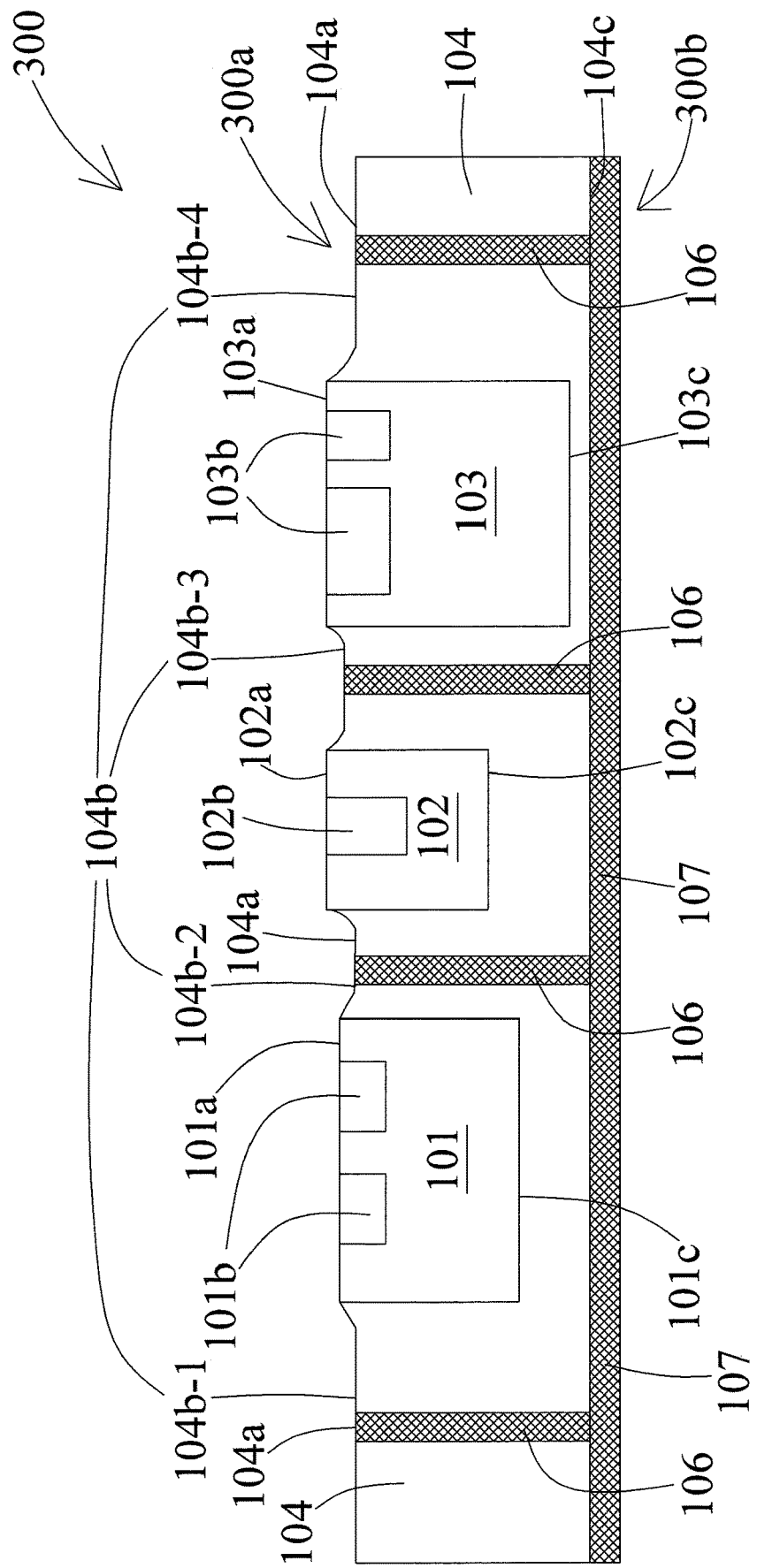
FIG. 3 is a schematic view of a semiconductor structure in accordance with some embodiments of the present disclosure.

FIG. 3 is an embodiment of a semiconductor structure 300. The semiconductor structure 300 includes several devices (101, 102, 103) and a molding 104 which have similar configurations as in FIG. 1 or 2. In some embodiments, the devices (101, 102, 103) are integrated or packaged to become the semiconductor structure 300. In some embodiments, the semiconductor structure 300 is a system in package (SiP). In some embodiments, the devices (101, 102, 103) include RF components and are integrated to become a radio frequency (RF) package.

In some embodiments, the semiconductor structure 300 includes a metallic shield 106 disposed within the molding 104 and between the devices (101, 102, 103). In some embodiments, the metallic shield 106 is extended between an active side 300a and a back side 300b of the semiconductor structure 300. In some embodiments, the metallic shield 106 is extended from a first surface 104a to a second surface 104c of the molding 104. In some embodiments, the metallic shield 106 is vertically disposed along a height of the semiconductor structure 300 and is extended along a length of the semiconductor structure 300. In some embodiments, the metallic shield 106 is supported by the molding 104. In some embodiments, the metallic shield 106 includes copper, aluminum, lead, solder, etc.

In some embodiments, the metallic shield 106 isolates the devices (101, 102, 103) from each other. In some embodiments, the metallic shield 106 defines several compartments to surround one of the devices (101, 102, 103) correspondingly. The metallic shield 106 is configured to prevent leakage of signal generated from the devices (101, 102, 103) and external electromagnetic interference to the devices (101, 102, 103). Therefore, performance of the devices (101, 102, 103) would not be affected by external environment.

In some embodiments, the semiconductor structure 300 includes a metallic coating 107 covering second surfaces (101c, 102c, 103c) of the devices (101, 102, 103) and a second surface 104c of the molding 104. The second surfaces (101c, 102c, 103c) of the devices (101, 102, 103) are opposite to the first surfaces (101a, 102a, 103a) of the devices (101, 102, 103) correspondingly, and the second surface 104c of the molding 104 is opposite to the first surface 104a of the molding 104.

In some embodiments, the metallic coating 107 covers the back side 300b of the semiconductor structure 300. In some embodiments, the metallic coating 107 is configured to prevent leakage of signal generated from the devices (101, 102, 103) and external electromagnetic interference to the devices (101, 102, 103). In some embodiments, the metallic coating 107 includes copper, aluminum, lead, etc. In some embodiments, the metallic coating 107 contacts with the metallic shield 106. In some embodiments, the metallic coating 107 and the metallic shield 106 include same material.

Figure 4:
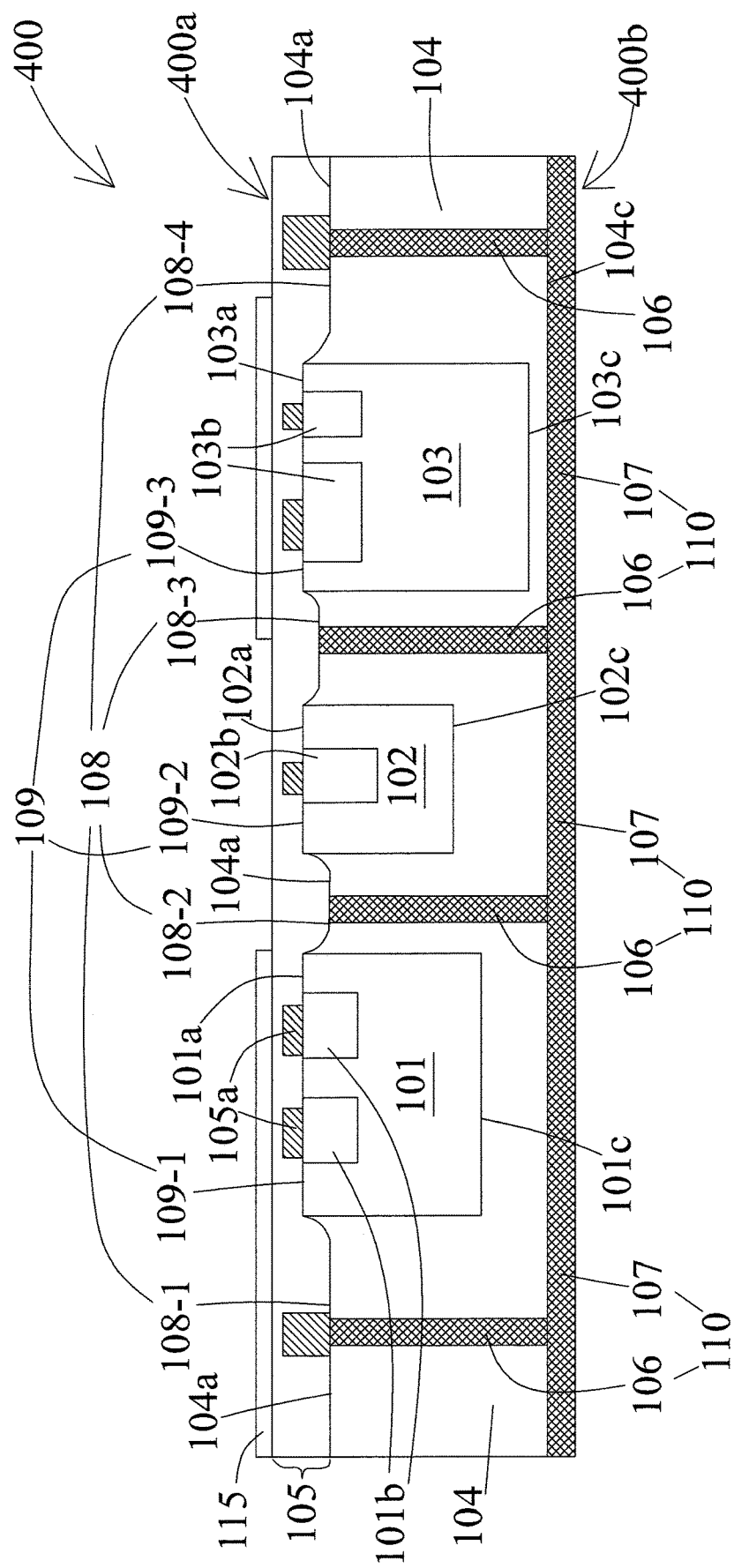
FIG. 4 is a schematic view of a semiconductor structure in accordance with some embodiments of the present disclosure.

FIG. 4 is an embodiment of a semiconductor structure 400. The semiconductor structure 400 includes several devices (101, 102, 103) and a molding 104 which have similar configurations as in FIG. 1, 2 or 3. In some embodiments, the devices (101, 102, 103) are integrated or packaged to become the semiconductor structure 400. In some embodiments, the semiconductor structure 400 is a system in package (SiP). In some embodiments, the devices (101, 102, 103) include RF components and are integrated to become a radio frequency (RF) package.

In some embodiments, a first interface 108 between the RDL 105 and the molding 104 is recessed from a second interface 109 between the RDL 105 and the devices (101, 102, 103). In some embodiments, a level of the first interface 108 is substantially greater than about 5 μm different from a level of the second interface 109. In some embodiments, the level of the first interface 108 is about 3 μm to about 30 μm different from the level of the second interface 109. In some embodiments, the level of the first interface 108 is about 5 μm to about 15 μm different from the level of the second interface 109.

In some embodiments, the first interface 108 includes several sections (108-1, 108-2, 108-3). In some embodiments, one of the sections (108-1, 108-2, 108-3, 108-4) is at a level different from a level of another one of the sections (108-1, 108-2, 108-3, 108-4). In some embodiments, the sections (108-1, 108-2, 108-3) are at substantially same level as each other.

In some embodiments, the second interface 109 includes several sections (109-1, 109-2, 109-3). In some embodiments, one of the sections (109-1, 109-2, 109-3) is at a level different from a level of another one of the sections (109-1, 109-2, 109-3). In some embodiments, the sections (109-1, 109-2, 109-3) are at substantially same level as each other.

In some embodiments, one of the sections (108-1, 108-2) of the first interface 108 is recessed from the section 109-1 of the second interface 109. In some embodiments, one of the sections (108-2, 108-2) of the first interface 108 is recessed from the section 109-2 of the second interface 109. In some embodiments, one of the sections (108-3, 108-4) of the first interface 108 is recessed from the section 109-3 of the second interface 109.

In some embodiments, a molding 104 is disposed between the devices (101, 102, 103), and a RDL 105 is disposed over the devices (101, 102, 103) and the molding 104. In some embodiments, the semiconductor structure 400 includes a metallic frame 110 disposed within the molding 104 and between the devices (101, 102, 103). In some embodiments, the metallic frame 110 covers a back side 400b of the semiconductor structure 400 and isolates the devices (101, 102, 103) from each other. In some embodiments, a bond pad 115 is disposed over and electrically connected to the RDL 105. In some embodiments, the bond pad 115 is a land grid array (LGA) pad configured to be mounted on a print circuit board (PCB). In some embodiments, the bond pad 115 is a ball grid array (BGA) pad configured to receive a conductive bump.

In some embodiments, the metallic frame 110 is electrically connected to the RDL 105. In some embodiments, the metallic frame 110 is contacted with a conductive interconnect structure of the RDL 105. In some embodiments, the metallic frame 110 includes a metallic shield 106 extending between an active side 400a and the back side 400b of the semiconductor structure 400, and a metallic coating 107 covering the back side 400b of the semiconductor structure 400. In some embodiments, the metallic shield 106 contacts with the conductive interconnect structure of the RDL 105.

In addition, as illustrated in FIGS. 1-4, none of the semiconductor structures (100, 200, 300, 400) includes a substrate or a carrier for supporting the devices (101, 102, 103). As a result, a material cost and a manufacturing cost of the substrate or carrier could be saved. Furthermore, the device 101 does not include pillar or bump on the die pad 101b, which could also save material and manufacturing cost.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations.

Figure 5:
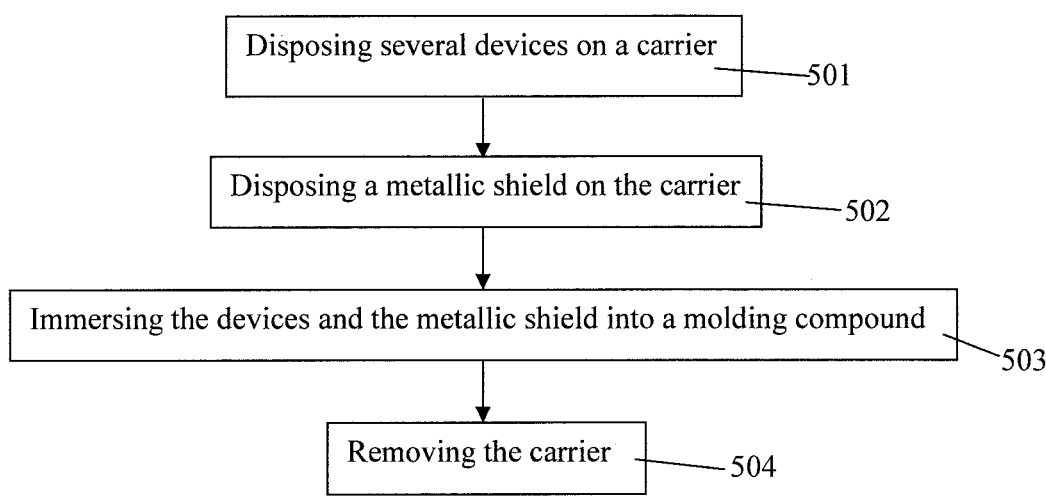
FIG. 5 is a flow diagram of a method of manufacturing a semiconductor structure in accordance with some embodiments of the present disclosure.

FIG. 5 is an embodiment of a method 500 of manufacturing a semiconductor structure. The method 500 includes a number of operations (501, 502, 503 and 504).

Figure 5A:
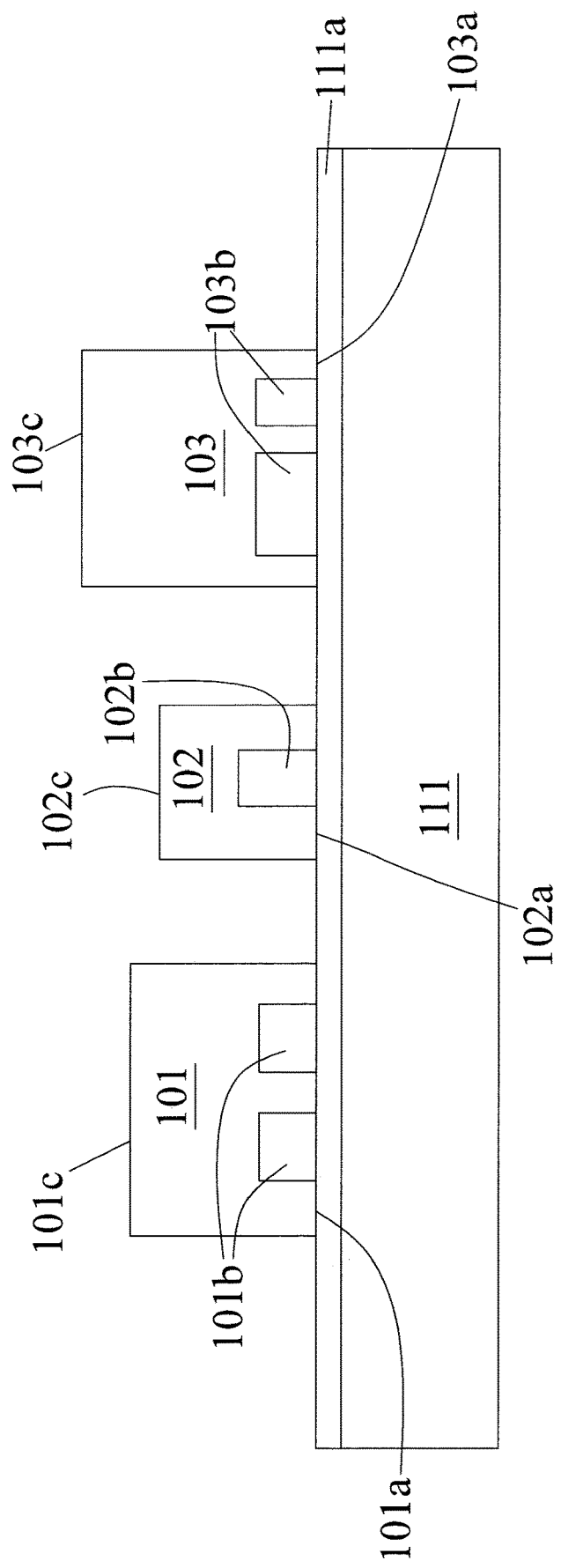
FIG. 5A is a schematic view of several devices disposed on a carrier in accordance with some embodiments of the present disclosure.

In operation 501, several devices (101, 102, 103) are disposed on a carrier 111 as shown in FIG. 5A. In some embodiments, the carrier 111 includes glass or silicon. In some embodiments, the devices (101, 102, 103) are temporarily attached to the carder 111. In some embodiments, first surfaces (101a, 102a, 103a) of the devices (101, 102, 103) are attached to the carrier 111 by an adhesive 111a such as a glue, a die attach film (DAF), or etc. In some embodiments, second surfaces (101c, 102c, 103c) of the devices (101, 102, 103) are opposite to first surfaces (101a, 102a, 103a) of the devices (101, 102, 103) respectively.

In some embodiments, the devices (101, 102, 103) include a packaged device and a unpackaged device. In some embodiments, the device 101 is a die or a chip. In some embodiments, the device 102 is a surface mount device (SMD). In some embodiments, the device 103 is a ball grid array (BGA) package, quad flat no lead (QFN) package, land grid array (LGA) package or other kinds of packages. In some embodiments, the devices (101, 102, 103) have similar configuration as in FIGS. 1-4.

In some embodiments, each of first surfaces (101a, 102a, 103a) of the devices (101, 102, 103) includes several active components thereon. In some embodiments, the first surface 101a of the device 101 includes a die pad 101b. The die pad 101b is configured to connect a circuitry within the device 101 with an external circuitry.

Figure 5B:
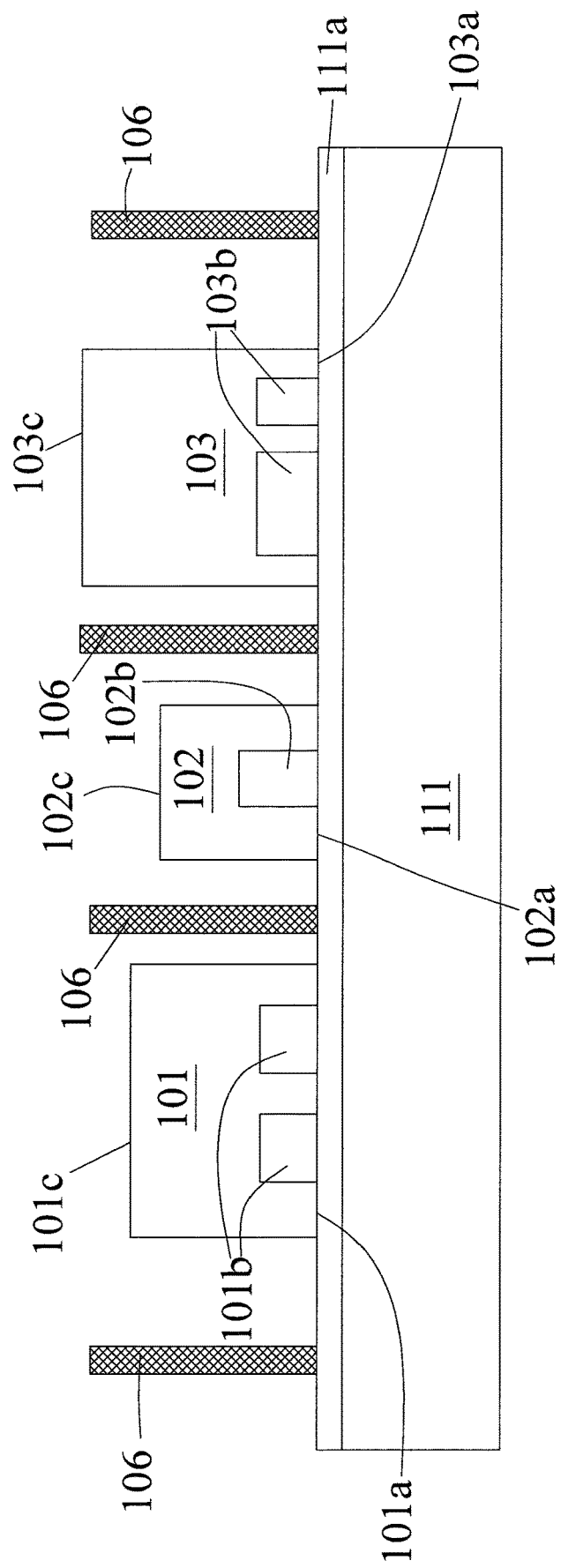
FIG. 5B is a schematic view of a metallic shield disposed on a carrier in accordance with some embodiments of the present disclosure.

In operation 502, a metallic shield 106 is disposed on the carrier 111 and between the devices (101, 102, 103) as shown in FIG. 5B. In some embodiments, the metallic shield 106 is disposed to surround each of the devices (101, 102, 103). The metallic shield 106 is configured to isolate the devices (101, 102, 103) from each other, prevent external electromagnetic interference to the devices (101, 102, 103) and prevent leakage of signals generated from the devices (101, 102, 103). In some embodiments, the metallic shield 106 is disposed upright to the carrier 111. In some embodiments, the metallic shield 106 has similar configuration as in FIGS. 1-4.

Figure 5C:
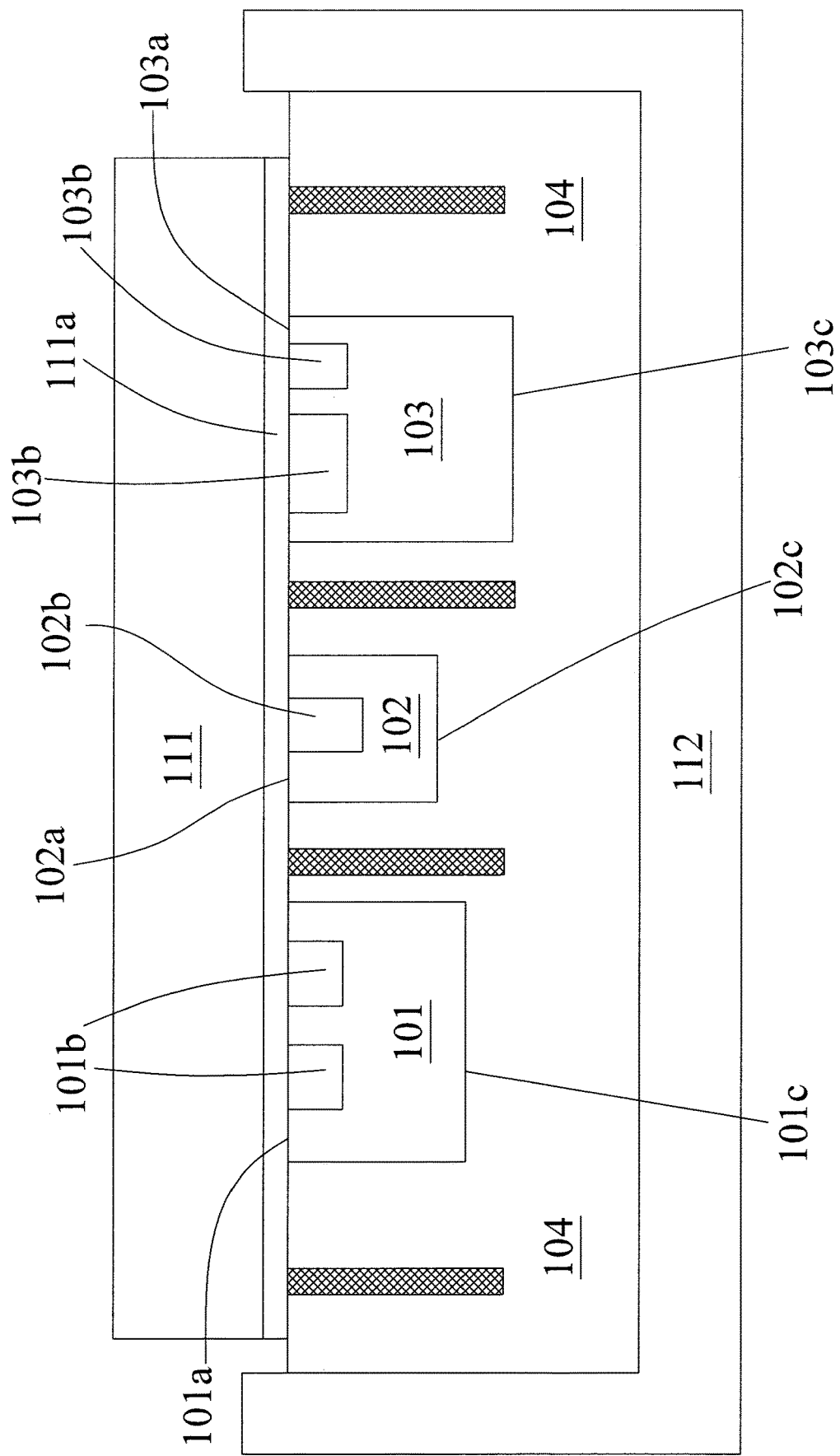
FIG. 5C is a schematic view of immersion molding operations in accordance with some embodiments of the present disclosure.
Figure 5D:
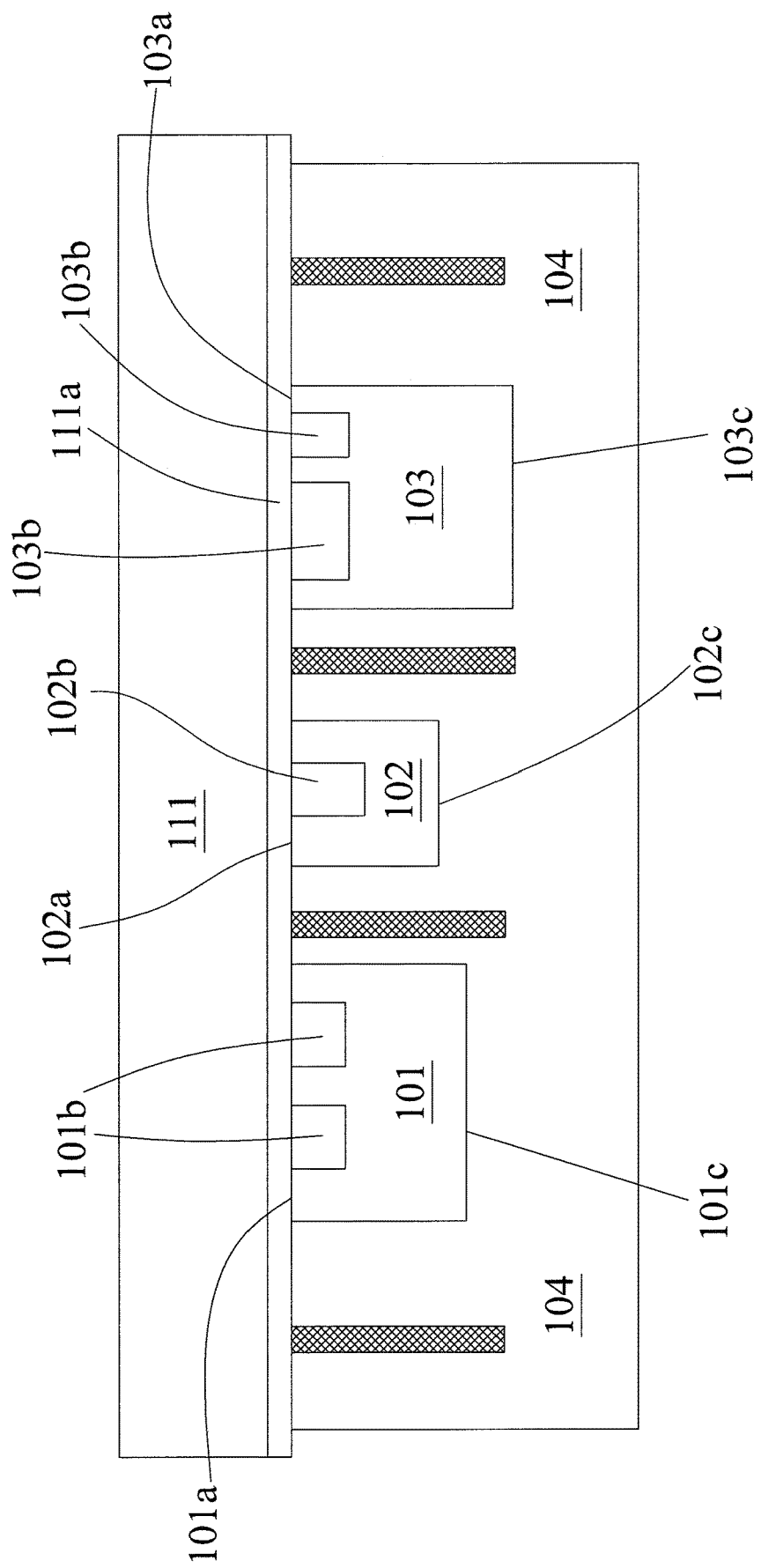
FIG. 5D is a schematic view of a molding in accordance with some embodiments of the present disclosure.

In operation 503, the devices (101, 102, 103) and the metallic shield 106 are immersed into a molding compound to dispose the molding compound between the devices (101, 102, 103) as shown in FIG. 5C. In some embodiments, the molding compound is contained in a mold case 112, and the devices (101, 102, 103) and the metallic shield 106 are flipped and immersed into the molding compound. A molding 104 including the molding compound and encapsulating the devices (101, 102, 103) and the metallic shield 106 is formed by the immersion molding operations. The devices (101, 102, 103) and the metallic shield 106 are withdrawn out of the mold chase 112 when the molding 104 is formed as shown in FIG. 5D.

Figure 5E:
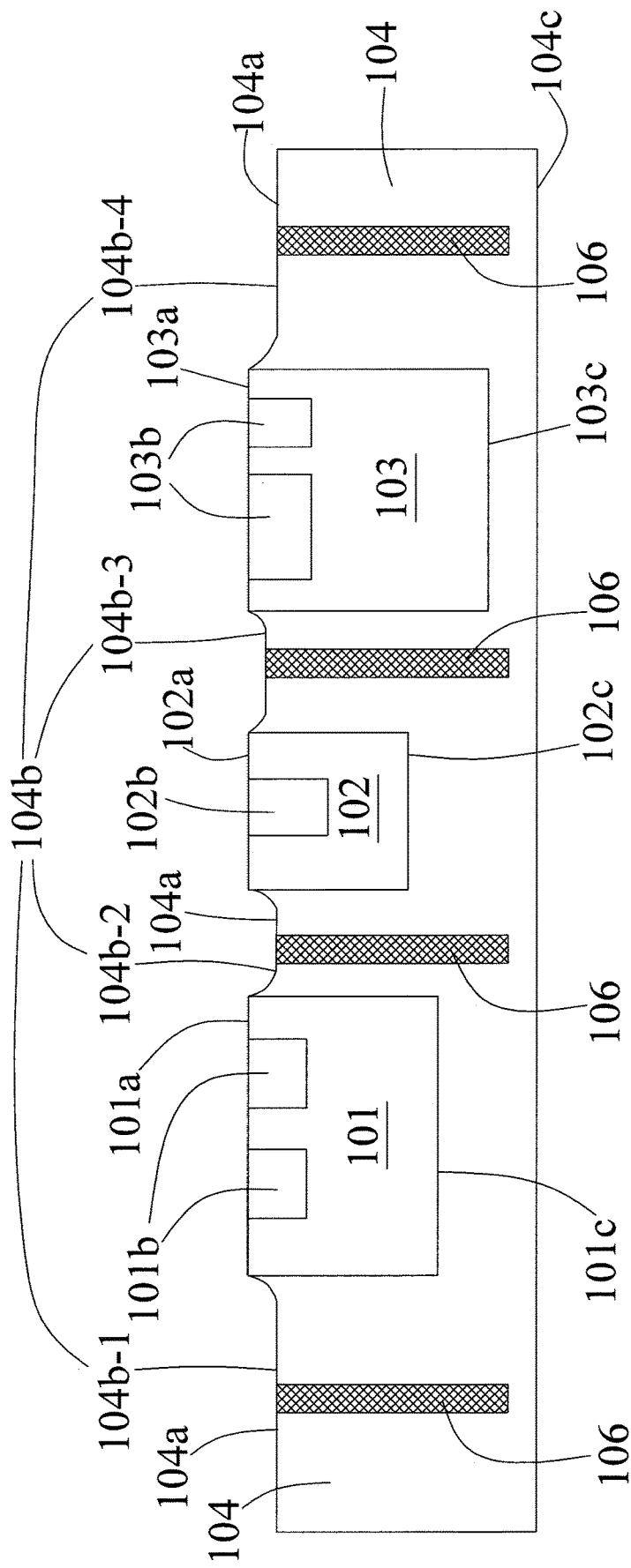
FIG. 5E is a schematic view of a recessed portion of a molding in accordance with some embodiments of the present disclosure.

In operation 504, the carrier 112 is removed from the devices (101, 102, 103) and the molding compound or the molding 104 as shown in FIG. 5E. The carrier 112 is removed from first surfaces (101a, 102a, 103a) of the devices (101, 102, 103) and a first surface 104a of the molding 104. When the carrier 112 is removed, the first surfaces (101a, 102a, 103a) of the devices (101, 102, 103) and some portions of the metallic shield 106 are exposed from the molding 104.

In some embodiments, the first surface 104a of the molding 104 adjacent to active components such as die pad 101b, conductive structure (102b or 103b), etc. includes a recessed portion 104b recessed from one of the first surfaces (101a, 102a, 103a) of the devices (101, 102, 103). When the carrier 112 is removed from the devices (101, 102, 103) and the molding 104, the recessed portion 104b is formed.

Since the adhesive 111a on the carrier 111 is flexible and soft, the first surfaces (101a, 102a, 103a) of the devices (101, 102, 103) would be slightly recessed into the adhesive 111a when disposing on the carrier 111. As a result, the recessed portion 104b of the molding 104 is formed. A stepped configuration between peripherals of first surfaces (101a, 102a, 103a) of the devices (101, 102, 103) and the first surface 104a of the molding 104 is formed. In some embodiments, the recessed portion 104b is recessed greater than about 5 μm from one of the first surfaces (101a, 102a, 103a) of the devices (101, 102, 103).

In some embodiments, a semiconductor structure is formed by a method 600. The method 600 includes a number of operations and the description and illustration are not deemed as a limitation as the sequence of the operations.

Figure 6:
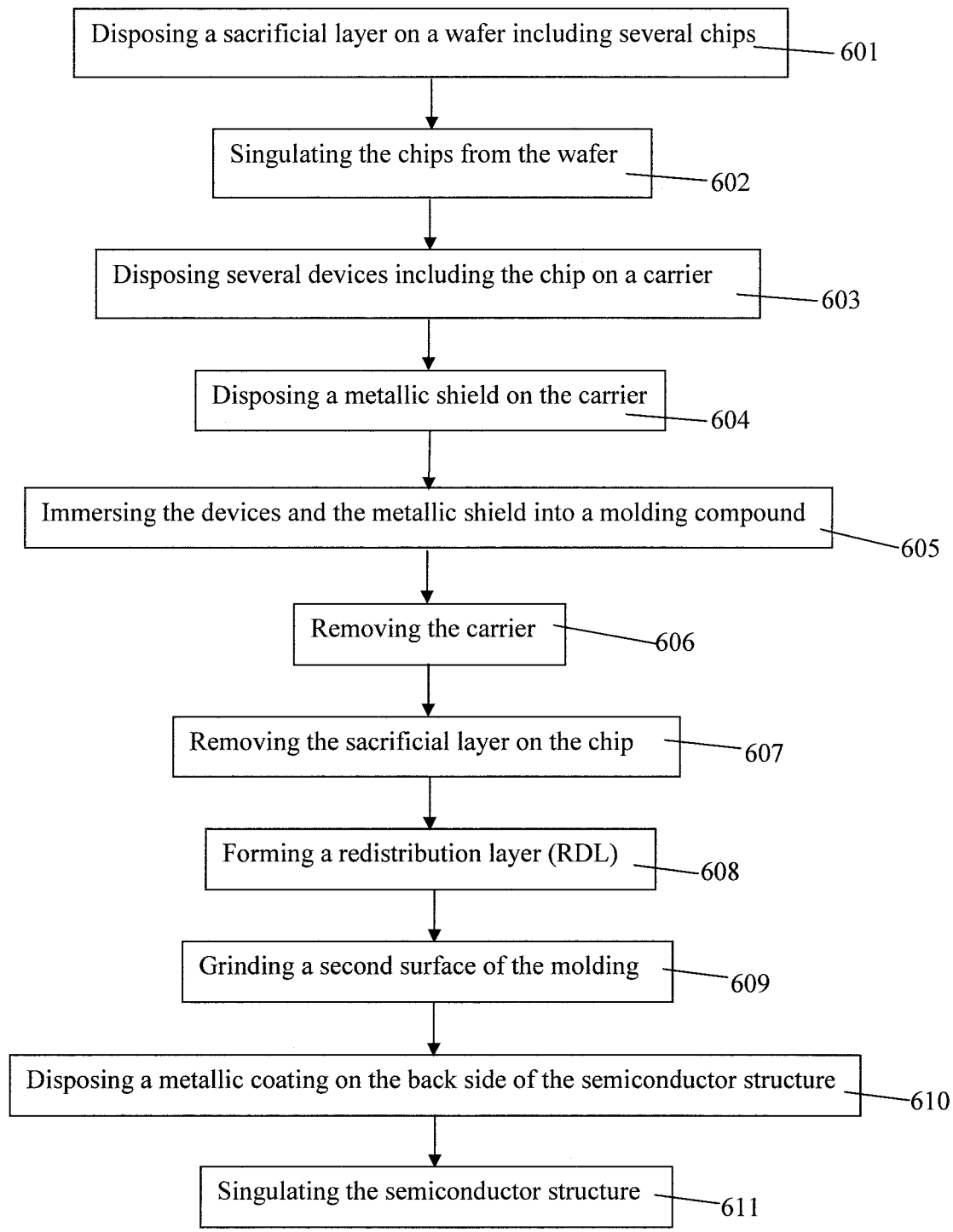
FIG. 6 is a flow diagram of a method of manufacturing a semiconductor structure in accordance with some embodiments of the present disclosure.

FIG. 6 is an embodiment of a method 600 of manufacturing a semiconductor structure. The method 600 includes a number of operations (601, 602, 603, 604, 605, 606, 607, 608, 609, 610 and 611).

Figure 6A:
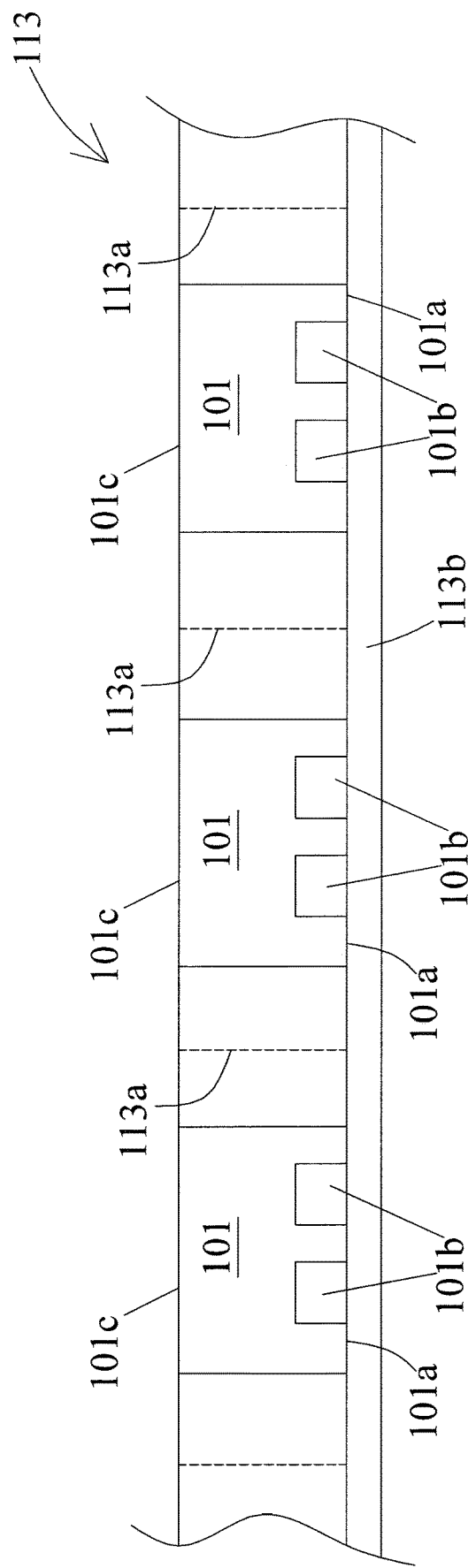
FIG. 6A is a schematic view of a wafer including several chips in accordance with some embodiments of the present disclosure.

In operation 601, a sacrificial layer 113b is disposed on a first surface 101a of the device 101 as shown in FIG. 6A. In some embodiments, the sacrificial layer 113b includes epoxy, polyamide, polybenzoxazole (PBG) or etc. In some embodiments, the sacrificial layer 113b is configured to protect the first surface 101a or active components such as a die pad 101b on the first surface 101a. In some embodiments, a wafer 113 includes several devices 101. The devices 101 are separated from each other by several scribe line regions 113a. In some embodiments, the wafer 113 is a silicon wafer. In some embodiments, the device 101 is a die or a chip including a circuitry. In some embodiments, several active components 101b are disposed on the first surface 101a of the device 101.

Figure 6B:
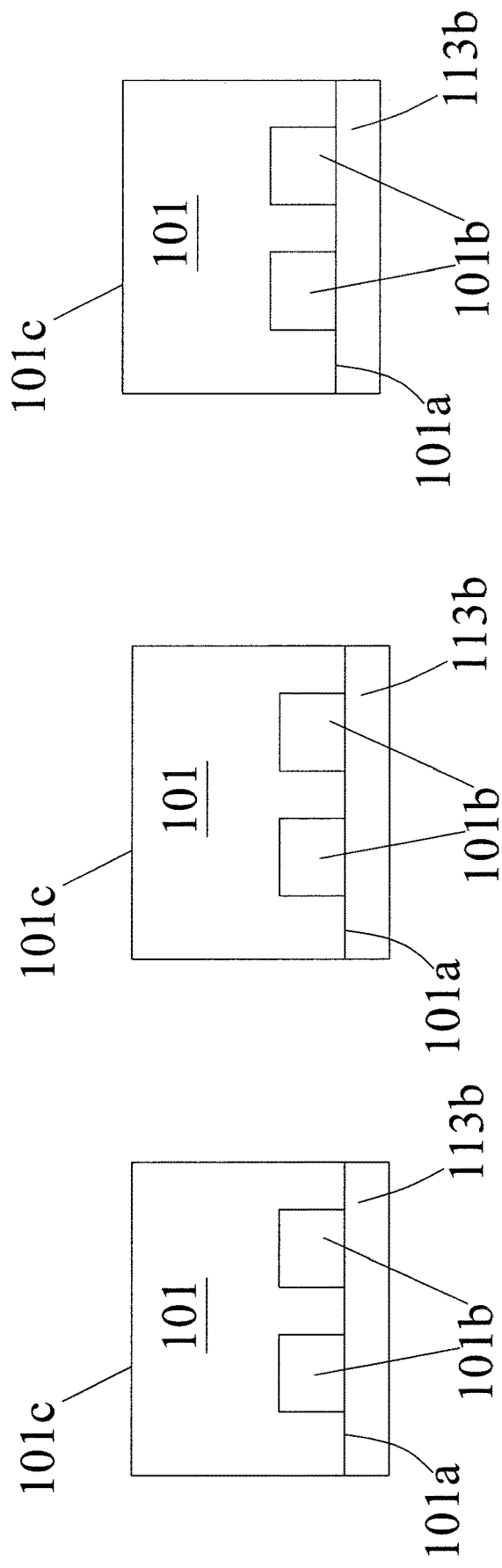
FIG. 6B is a schematic view of several chips singulated from a wafer in accordance with some embodiments of the present disclosure.

In operation 602, the devices 101 are singulated from the wafer 113 as shown in FIG. 6B. The wafer 113 is singulated into several individual devices 101 along the scribe line regions 113*a* (referring to FIG. 6A). In some embodiments, the wafer 113 is singulated by a mechanical or laser blade. The sacrificial layer 113*b* is disposed on the first surface 101*a* of the device 101.

Figure 6C:
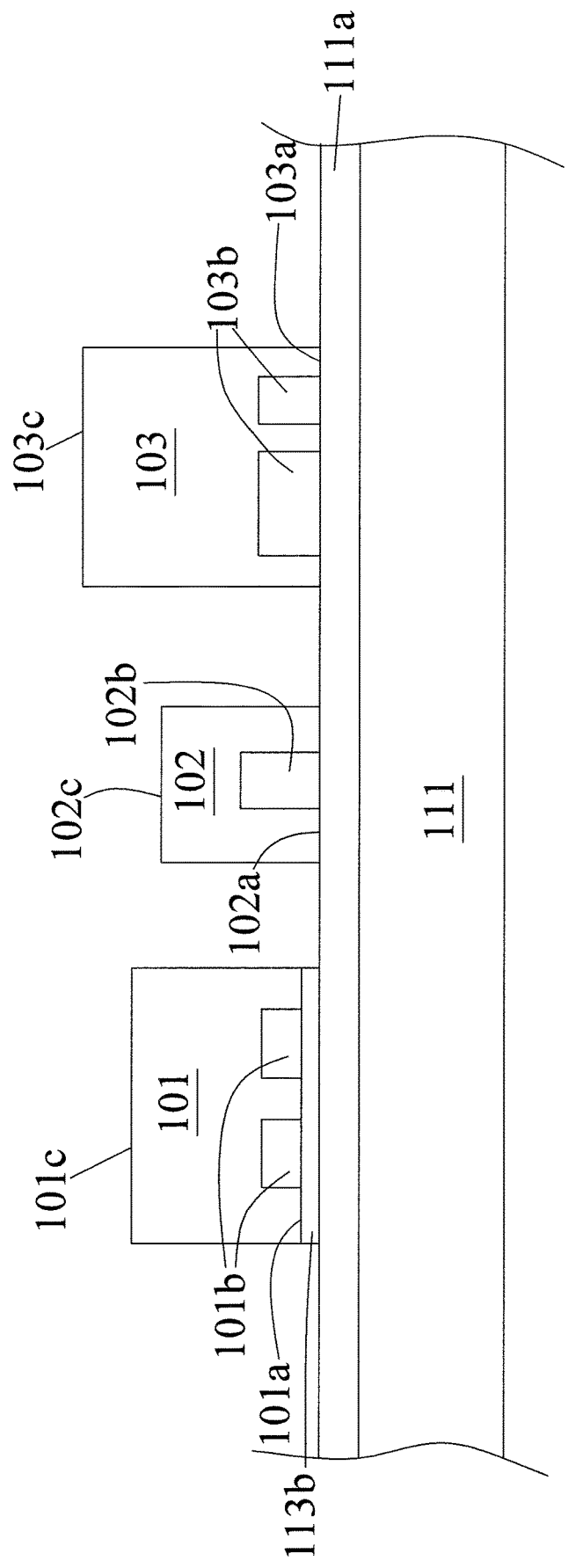
FIG. 6C is a schematic view of several devices disposed on a carrier in accordance with some embodiments of the present disclosure.

In operation 603, several devices (101, 102, 103) are disposed on a carrier 111 as shown in FIG. 6C. In some embodiments, the device 101 singulated from the wafer 113 (referring to FIG. 6A) and the devices (102, 103) are disposed on the carrier 111. In some embodiments, first surfaces (101*a*, 102*a*, 103*a*) of the devices (101, 102, 103) are attached to the carrier 111 by an adhesive 111*a*. In some embodiments, the sacrificial layer 113*b* of the device 101 is slightly inserted into the adhesive 111*a*, since the adhesive 111*a* is flexible and soft. In some embodiments, the operation 603 is similar to the operation 501 as shown in FIG. 5A.

Figure 6D:
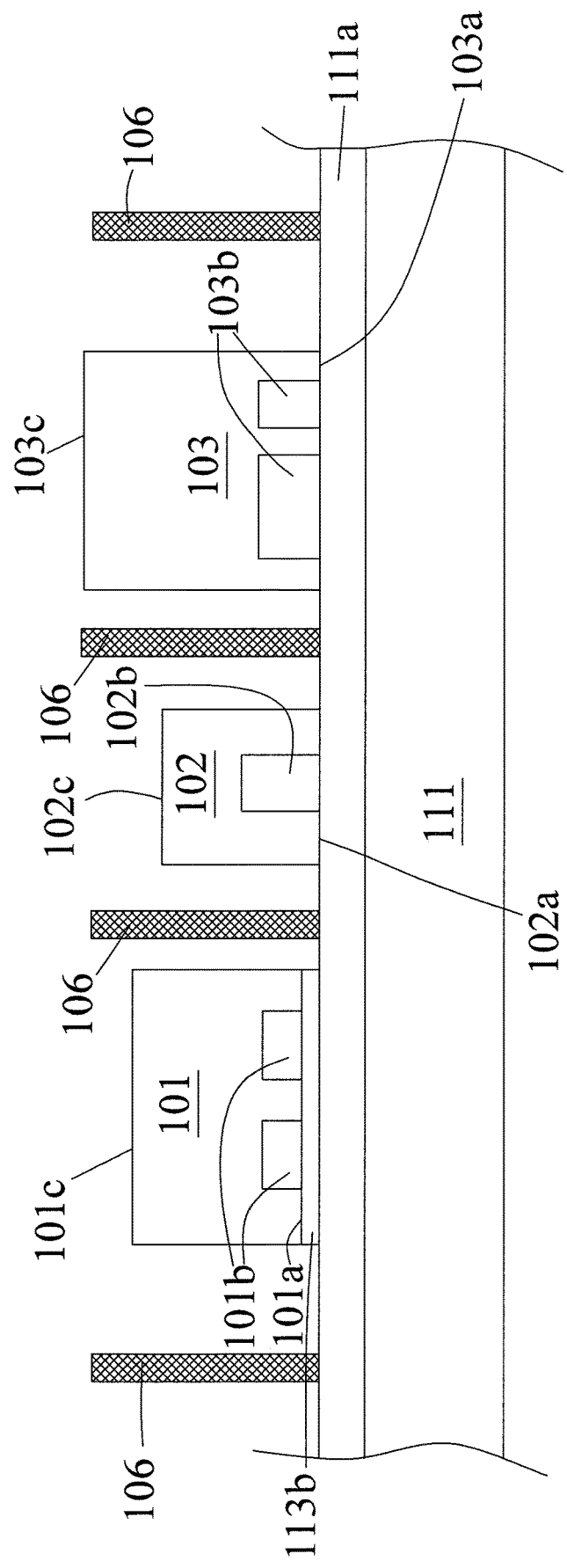
FIG. 6D is a schematic view of a metallic shield disposed on a carrier in accordance with some embodiments of the present disclosure.

In operation 604, a metallic shield 106 is disposed on the carrier 111 as shown in FIG. 6D. In some embodiments, the metallic shield 106 is disposed between the devices (101, 102, 103), such that the devices (101, 102, 103) are isolated from each other. In some embodiments, the operation 604 is similar to the operation 502 as shown in FIG. 5B.

Figure 6E:
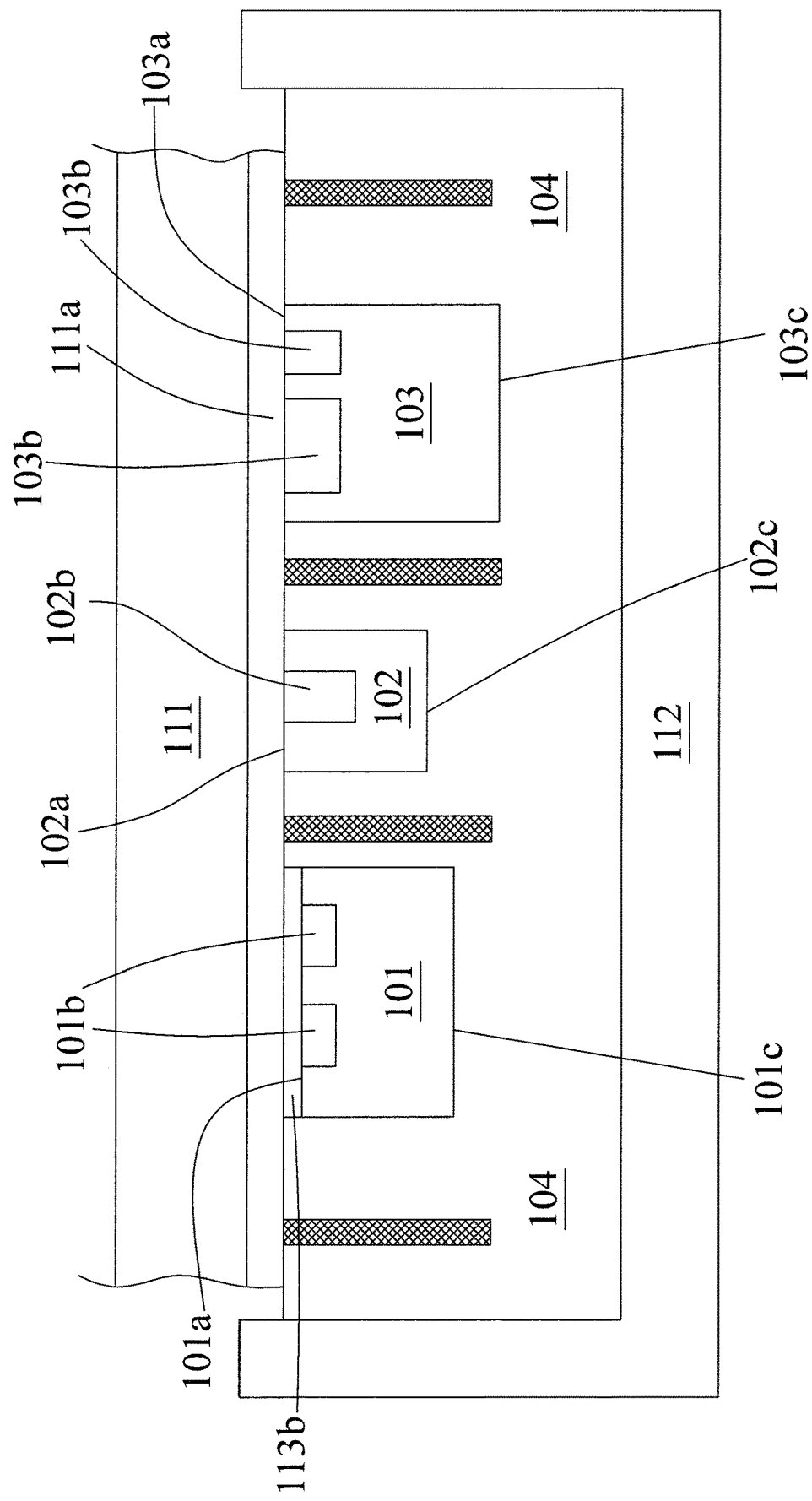
FIG. 6E is a schematic view of immersion molding operations in accordance with some embodiments of the present disclosure.
Figure 6F:
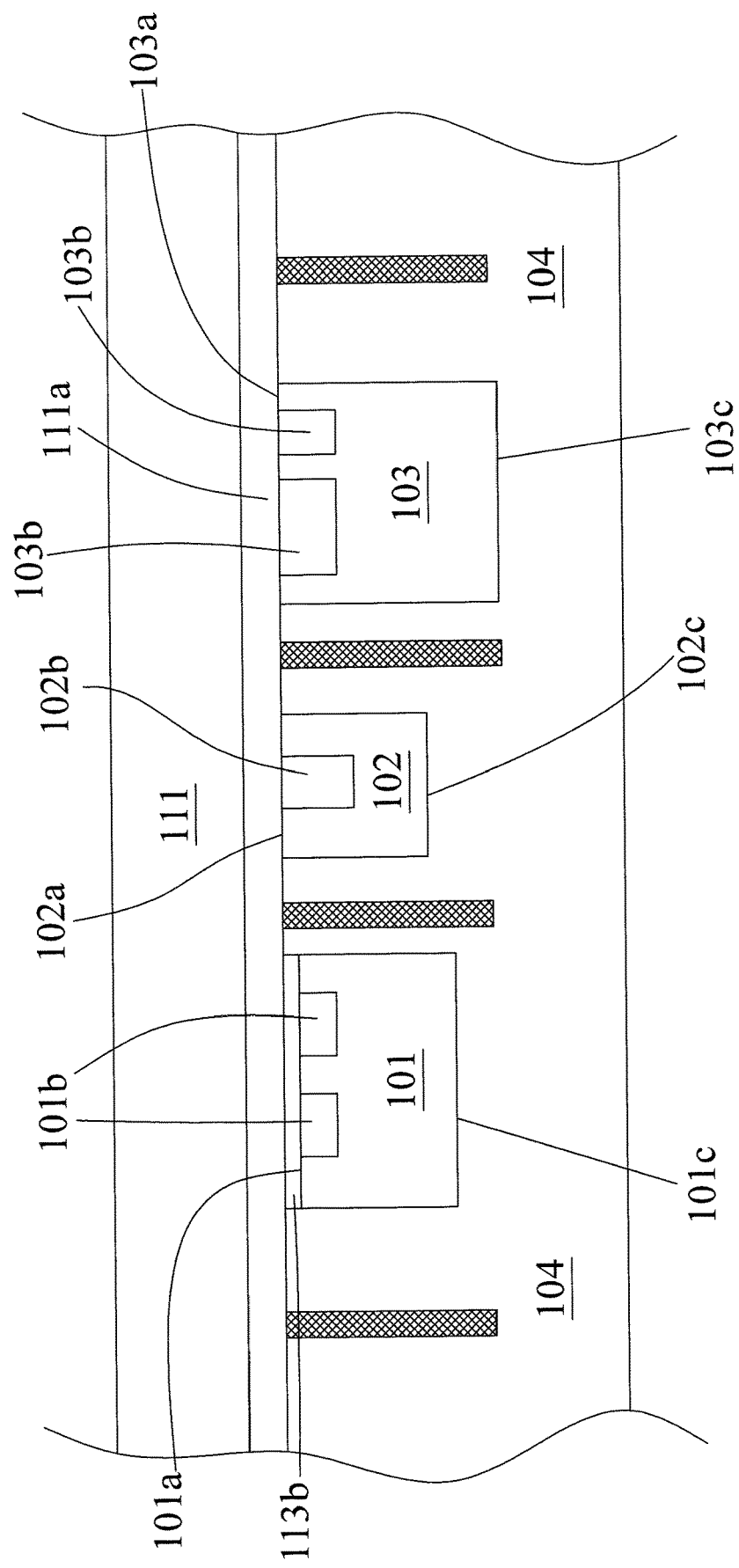
FIG. 6F is a schematic view of a molding in accordance with some embodiments of the present disclosure.

In operation 605, the devices (101,102,103) and the metallic shield 106 are immersed into a molding compound to dispose the molding compound between the devices (101, 102, 103) as shown in FIG. 6E. In some embodiments, the molding compound is contained in a mold case 112, and the devices (101, 102, 103) and the metallic shield 106 are flipped and immersed into the molding compound. A molding 104 including the molding compound and encapsulating the devices (101, 102, 103) and the metallic shield 106 is formed by the immersion molding operations. In some embodiments, the operation 605 is similar to the operation 503 as shown in FIG. 5C. The devices (101, 102, 103) and the metallic shield 106 are withdrawn out of the mold chase 112 when the molding 104 is formed as shown in FIG. 6F.

Figure 6G:
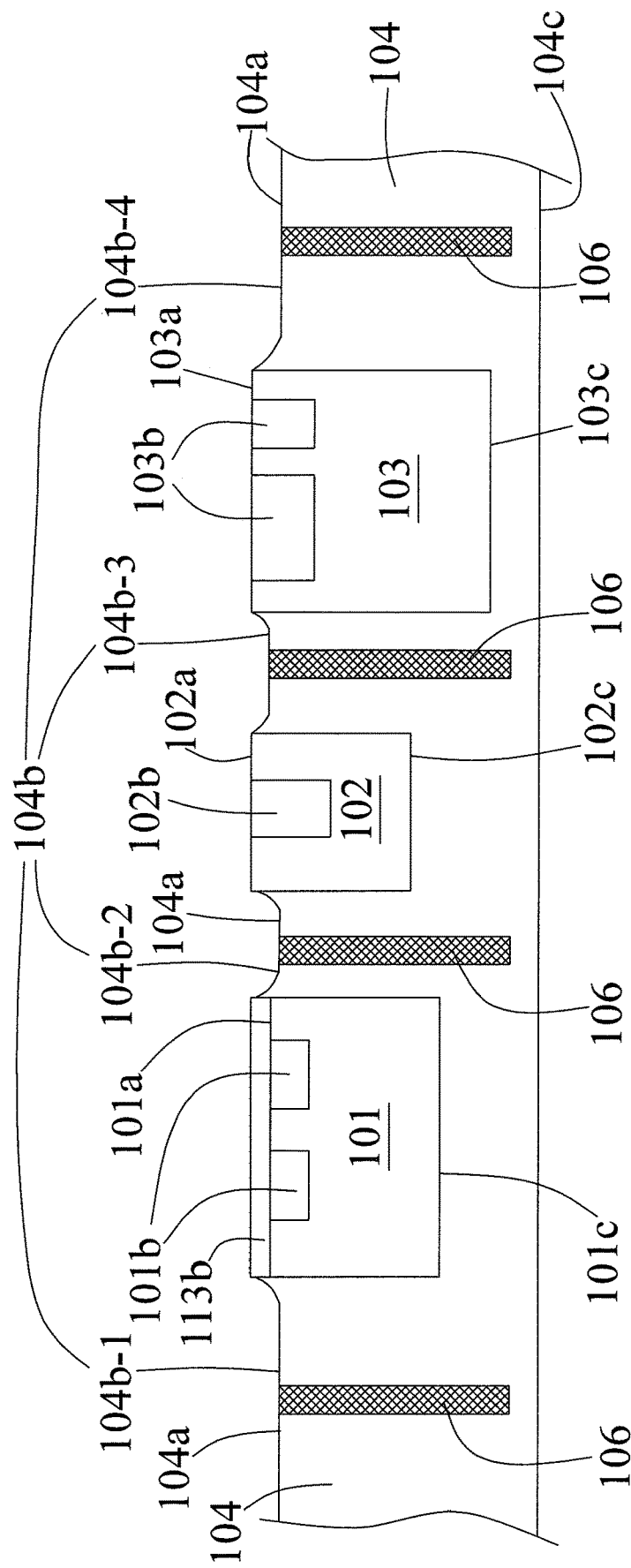
FIG. 6G is a schematic view of a recessed portion of a molding in accordance with some embodiments of the present disclosure.

In operation 606, the carrier 111 (referring to FIG. 6F) is detached and removed from the devices (101, 102, 103) and the molding 104 as shown in FIG. 6G. The molding 104 surrounds and supports the devices (101, 102, 103) and the metallic shield 106. In some embodiments, the carrier 111 is detached from the first surfaces (101*a*, 102*a*, 103*a*) of the devices and the first surface 104*a* of the molding 104. In some embodiments, a recessed portion 104*b* is formed when the carrier 111 is detached from the devices (101, 102, 103) and the molding 104.

Figure 6H:
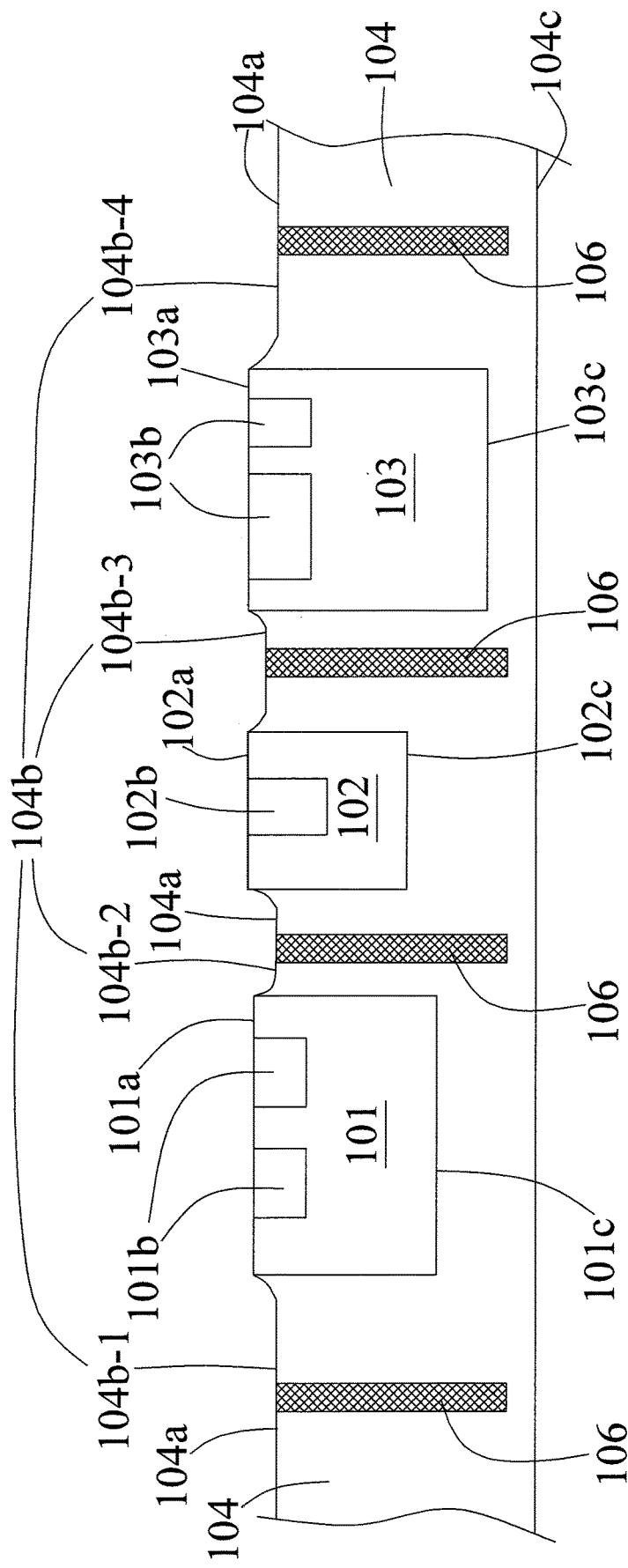
FIG. 6H is a schematic view of a recessed portion of a molding in accordance with some embodiments of the present disclosure.

In operation 607, the sacrificial layer 113*b* (referring to FIG. 6G) is removed from the first surface 101*a* of the device 101 as shown in FIG. 6H. In some embodiments, the sacrificial layer 113*b* is removed from the first surface 101*a* by etching operations. When the carrier 111 and the sacrificial layer 113*b* are removed, the recessed portion 104*b* is formed. The recessed portion 104*b* is recessed from one of the first surfaces (101*a*, 102*a*, 103*a*) of the devices (101, 102, 103).

In some embodiments, the recessed portion 104*b* is recessed greater than about 5 µm from one of the first surfaces (101*a*, 102*a*, 103*a*) of the devices (101, 102, 103). In some embodiments, the recessed portion 104*b* includes several sections (104*b*-1, 104*b*-2, 104*b*-3, 104*b*-4) recessed from one of the devices (101, 102, 103) and disposed at levels different from each other. For example, a section 104*b*-3 is at a level different from another section 104*b*-1. In some embodiments, the sections (104*b*-1, 104*b*-2, 104*b*-3) are formed at a level different from each other after the operation 606 or after the operation 607. In some embodiments, a vertical distance between the section (104*b*-1 or 104*b*-2) surrounding the device 101 and the first surface 101*a* of the device 101 is substantially smaller than or equal to a vertical distance between the section (104-3 or 104*b*-4) surrounding the device (102 or 103) and the first surface (102*a* or 103*a*) of the device (102 or 103).

Figure 6I:
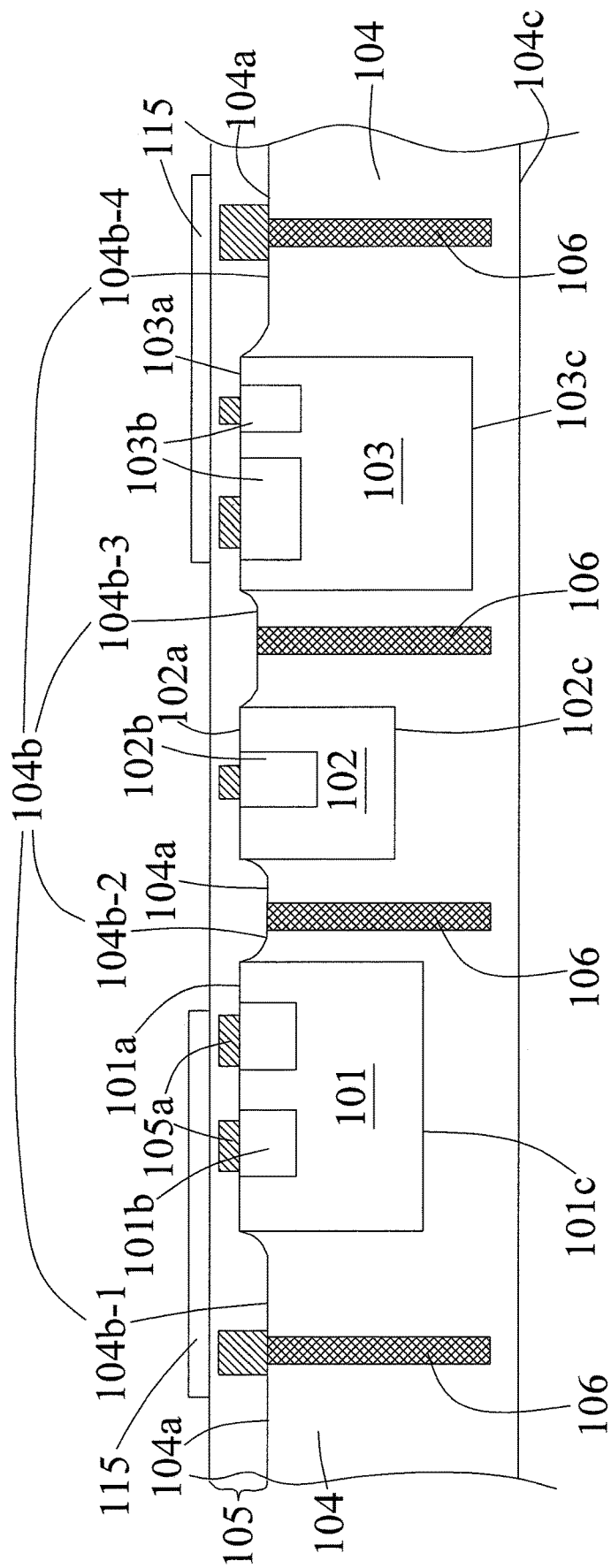
FIG. 6I is a schematic view of a redistribution layer (RDL) in accordance with some embodiments of the present disclosure.

In operation 608, a redistribution layer (RDL) 105 is formed on the first surfaces (101*a*, 102*a*, 103*a*) of the devices (101, 102, 103) and the first surface 104*a* of the molding 104 as shown in FIG. 6I. In some embodiments, the RDL 105 is an electrical connection to and/or between the devices (101, 102, 103) and circuitry external to the devices (101, 102, 103). The RDL 105 re-routes a path of a circuit from a die pad 101*b* or conductive structures (102*b*, 103*b*) to the circuitry external to the devices (101, 102, 103). In some embodiments, the RDL 105 electrically connects with the metallic shield 106. Portions of the metallic shield 106 exposed from the first surface 104*a* of the molding 104 are contacted with the RDL 105. In some embodiments, a bond pad 115 is formed over and electrically connected to the RDL 105. In some embodiments, the bond pad 115 is a land grid array (LGA) pad configured to be mounted on a print circuit board (PCB). In some embodiments, the bond pad 115 is a ball grid array (BGA) pad configured to receive a conductive bump. In some embodiments, the bond pad 115 is disposed by electroplating operations or any other suitable operations.

Figure 6J:
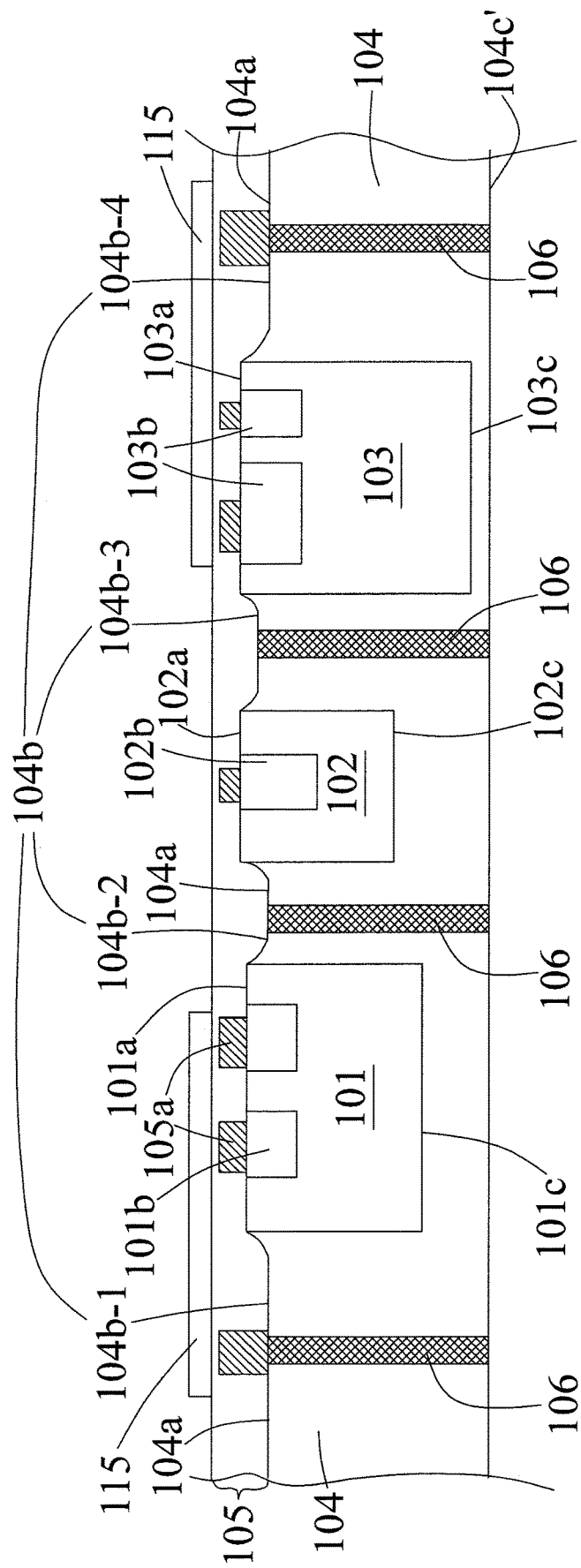
FIG. 6J is a schematic view of a ground second surface of a molding in accordance with some embodiments of the present disclosure.

In operation 609, a second surface 104*c* (referring to FIG. 6I) of the molding 104 is ground towards the first surface 104*a* of the molding 104 and the first surfaces (101*a*, 102*a*, 103*a*) of the devices (101, 102, 103) to become the second surface 104*c*' as shown in FIG. 6J. In some embodiments, the second surface 104*c* is ground to become the second surface 104*c*' to expose the metallic shield 106 disposed within the molding 104 and between the devices (101, 102, 103) from the second surface 104*c*' of the molding 104. Portions of the metallic shield 106 are exposed from the second surface 104*c*' after the grinding operations.

Figure 6K:
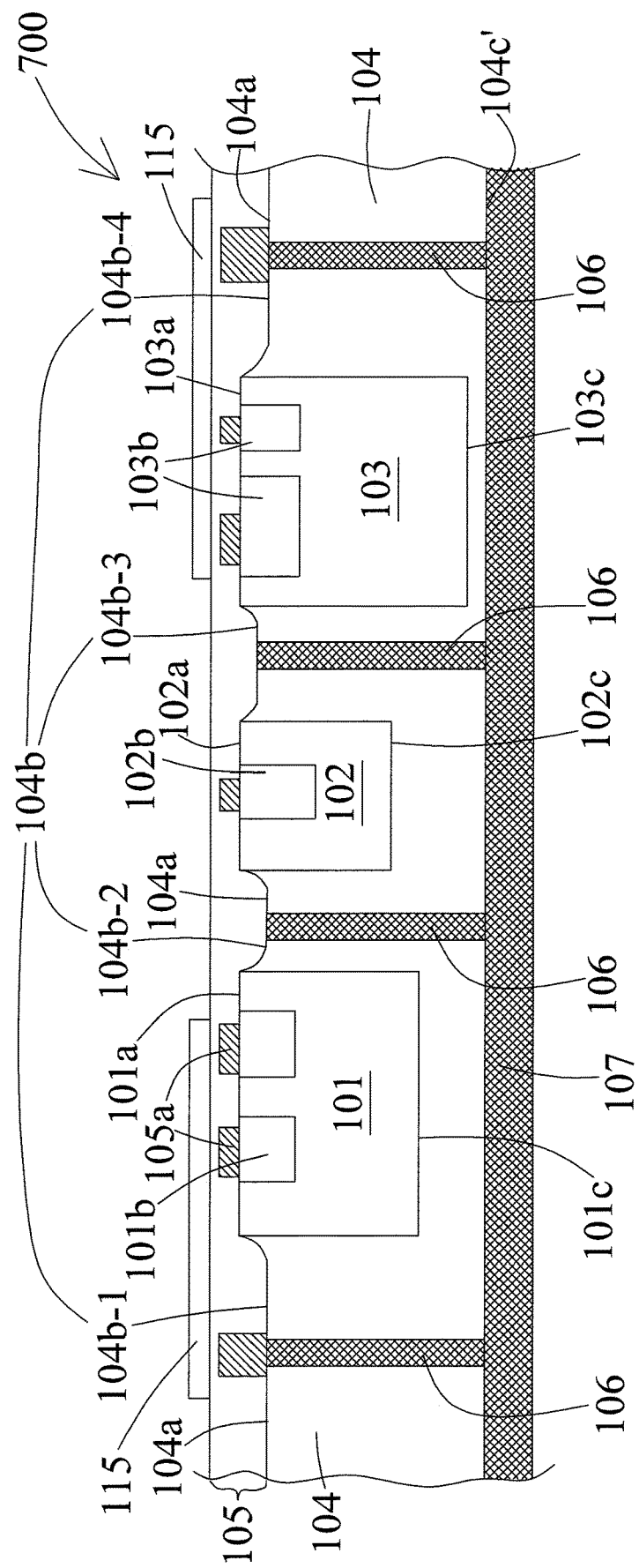
FIG. 6K is a schematic view of a metallic coating in accordance with some embodiments of the present disclosure.

In operation 610, a metallic coating 107 is disposed on the second surface 104*c*' of the molding 104 as shown in FIG. 6K. In some embodiments, the second surface 104*c*' is opposite to the first surface 104*a* of the molding 104, and the metallic coating 107 covers the second surface 104*c*' of the molding 104. In some embodiments, the metallic coating 107 is contacted with the metallic shield 106 exposed from the second surface 104*c*'. In some embodiments, the metallic coating 107 is electrically connected with the metallic shield 106 and/or the RDL 105. In some embodiments, a semiconductor structure 700 is formed. The semiconductor structure 700 has similar configuration as the semiconductor structure 400 as shown in FIG. 4.

Figure 6L:
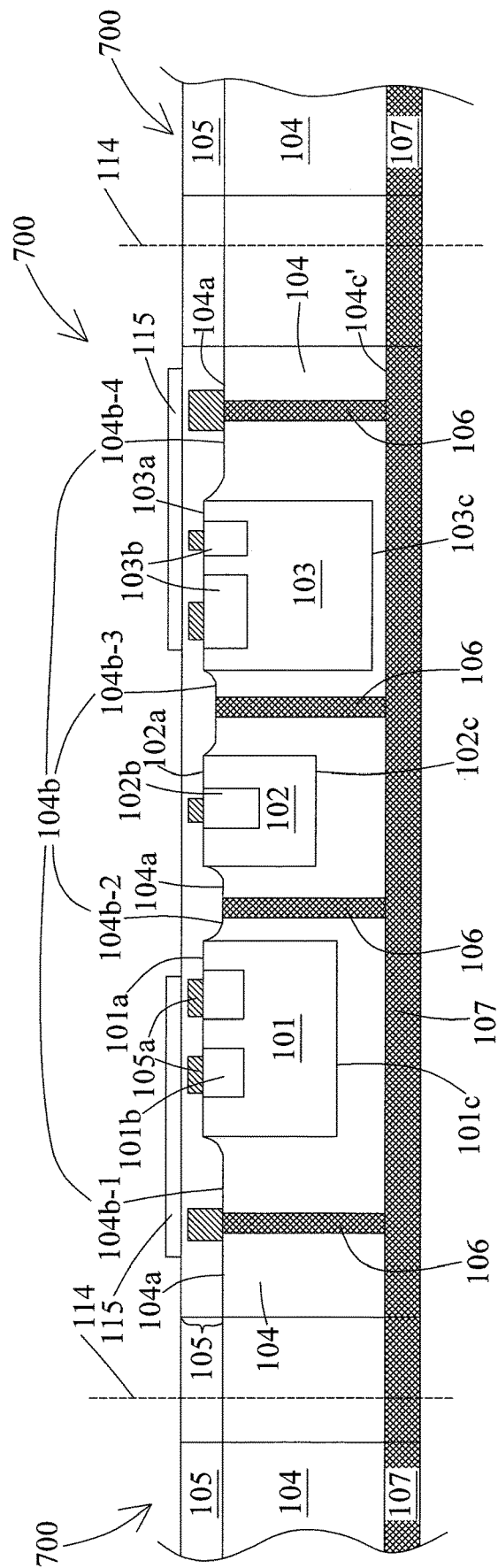
FIG. 6L is a schematic view of several semiconductor structures neighbored with each other in accordance with some embodiments of the present disclosure.
Figure 6M:
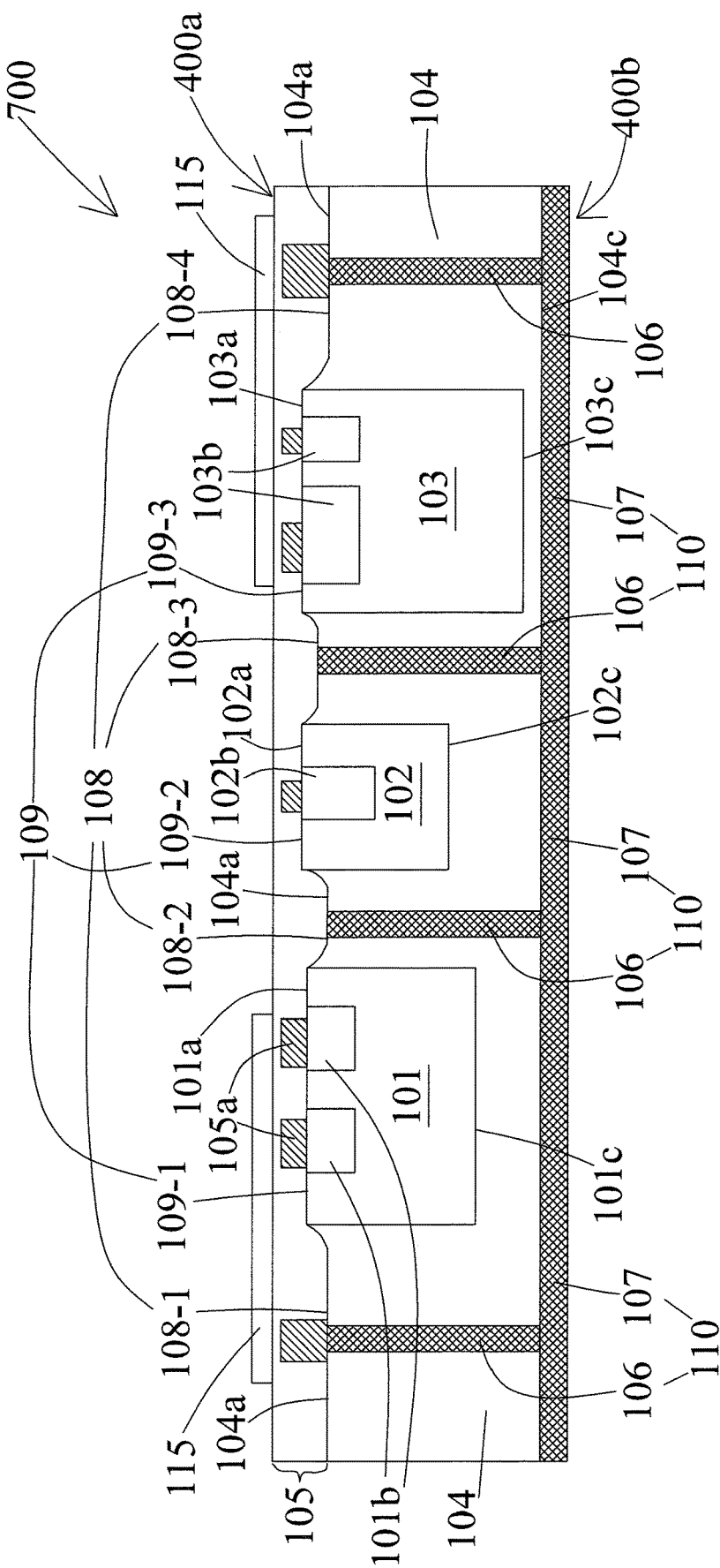
FIG. 6M is a schematic view of a semiconductor structure in accordance with some embodiments of the present disclosure.

In operation 611, the semiconductor structure 700 is singulated as shown in FIG. 6L. In some embodiments, several pieces of the semiconductor structures 700 are formed simultaneously by operations 601-610. The semiconductor structures 700 are horizontally arranged and neighbored with each other. The molding 104 connects the semiconductor structures 700 with each other. The semiconductor structures 700 are separated along several scribe line regions 114. Several pieces of the semiconductor structure 700 as shown in FIG. 6M are singulated by sawing along the scribe line regions 114. Therefore, several pieces of the semiconductor structure 700 are produced. In some embodiments, the semiconductor structures 700 structurally same as each other.

In the present disclosure, an improved semiconductor structure is disclosed. The semiconductor structure includes several devices, a metallic shield and a molding. The molding is formed by immersion molding operations, such that the molding could fully encapsulate the devices and the metallic shield. The metallic shield would not obstruct the formation of the molding during the immersion molding operations.

Furthermore, the molding could support the devices in different dimensions. Thus, different types of devices could be integrated into a single module. In addition, a substrate or carrier is not necessary in order to save manufacturing cost. Further, a sacrificial layer is disposed on one of the devices, such that a recessed portion of the molding is formed. A pillar or bump is not necessary to be disposed on a die pad of the device.

In some embodiments, a semiconductor structure is provided. The semiconductor structure includes a molding, a device in the molding, and a redistribution layer (RDL) over the device and the molding. The RDL includes a first portion directly over a surface of the molding, and a second portion directly over a surface of the device. A bottom surface of the first portion is in contact with the surface of the molding, and a bottom surface of the second portion is in contact with the surface of the device. The bottom surface of the first portion of the RDL and the bottom surface of the second portion of the RDL are at different levels and misaligned from each other. A thickness of the first portion is greater than a thickness of the second portion.

In some embodiments, a system in package (SiP) is provided. The system in package includes a molding, a device in the molding, a pair of metallic shields disposed within the molding and al two sides of the device, and a RDL disposed over the device and the molding. The RDL includes a first portion directly over the molding, a second portion directly over the device. A bottom surface of the first portion is in contact with a surface of the molding, and a bottom surface of the second portion is in contact with a surface of the device. The bottom surface of the first portion of the RDL and the bottom surface of the second portion of the RDL are at different levels and misaligned from each other. A thickness of the first portion is greater than a thickness of the second portion.

In some embodiments, a semiconductor structure is provided. The semiconductor structure includes a metallic layer, a molding disposed over the metallic layer, a device surrounded by the molding, a pair of metallic shields disposed within the molding at two sides of the device, and a RDL. The pair of metallic shields are in contact with the metallic layer. The RDL is disposed over the molding, the device and the pair of metallic shields. The RDL includes a first portion directly over the molding and a second portion directly over the plurality of the devices. A bottom surface of the first portion is in contact with a surface of the molding, and a bottom surface of the second portion is in contact with a surface of the device. The bottom surface of the first portion of the RDL and the bottom surface of the second portion of the RDL are at different levels and misaligned from each other. A thickness of the first portion is greater than a thickness of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure comprising:
   a molding;
   a device disposed in the molding; and
   a redistribution layer (RDL) over the device and the molding,
   wherein the RDL comprises a first portion directly over a surface of the molding, a second portion directly over a surface of the device, a bottom surface of the first portion is in contact with the surface of the molding, a bottom surface of the second portion is in contact with the surface of the device, the bottom surface of the first portion of the RDL and the bottom surface of the second portion of the RDL are at different levels and misaligned from each other, and a thickness of the first portion is greater than a thickness of the second portion.

2. The semiconductor structure of claim 1, wherein the device comprises at least a die pad, and a surface of the die pad is substantially aligned with the surface of the device.

3. The semiconductor structure of claim 2, wherein the RDL further comprises a conductive interconnect structure in contact with the die pad.

4. The semiconductor structure of claim 1, further comprising a bond pad disposed over and electrically connected to the RDL.

5. The semiconductor structure of claim 1, wherein the thickness of the first portion of the RDL is substantially greater than the thickness of the second portion of the RDL about 5 µm.

6. The semiconductor structure of claim 1, wherein the device includes an unpackaged device or a packaged device.

7. The semiconductor structure of claim 1, further comprising a pair of metallic shields disposed at two sides of the device in the molding.

8. The semiconductor structure of claim 7, further comprising a metallic layer coupled to the pair of metallic shields.

9. The semiconductor structure of claim 8, wherein the metallic layer covers a surface of the molding opposite to the RDL.

10. A system in package (SiP) comprising:
    a molding;
    a device disposed in the molding;
    a pair of metallic shields disposed within the molding and at two sides of the device; and
    a redistribution layer (RDL) disposed over the device and the molding,
    wherein the RDL comprises a first portion directly over the molding, a second portion directly over the device, a bottom surface of the first portion is in contact with a surface of the molding, a bottom surface of the second portion is in contact with a surface of the device, the bottom surface of the first portion of the RDL and the bottom surface of the second portion of the RDL are at different levels and misaligned from each other, and a thickness of the first portion is greater than a thickness of the second portion.

11. The system in package of claim 10, wherein the RDL comprises a first conductive interconnect structure disposed in the second portion, and the device is electrically connected to the first conductive interconnect structure of the RDL.

12. The system in package of claim 11, further comprising at least a die pad disposed in the device and electrically connected to the first conductive interconnect structure.

13. The system in package of claim 11, wherein the RDL comprise a second conductive interconnect structure disposed in the first portion, and the metallic shield is electrically connected to the second conductive interconnect structure of the RDL.

14. The system in package of claim 13, wherein a thickness of the second conductive interconnect structure is greater than a thickness of the first conductive interconnect structures.

15. The system in package of claim 10, further comprising a bond pad disposed over and electrically connected to the RDL.

16. A semiconductor structure, comprising:
a metallic layer;
a molding disposed over the metallic layer;
a device surrounded by the molding;
a pair of metallic shields disposed within the molding and at two sides of the device,
wherein the pair of metallic shields is in contact with the metallic layer; and
a redistribution layer (RDL) disposed over the molding, the device and the pair of metallic shields,
wherein the RDL comprises a first portion directly over the molding, a second portion directly over the plurality of the devices, a bottom surface of the first portion is in contact with a surface of the molding, a bottom surface of the second portion is in contact with a surface of the device, the bottom surface of the first portion of the RDL and the bottom surface of the second portion of the RDL are at different levels and misaligned from each other, and a thickness of the first portion is greater than a thickness of the second portion.

17. The semiconductor structure of claim 16, wherein the RDL comprises:
at least a first conductive interconnect structure disposed in the second portion; and
at least a second conductive interconnect structure disposed in the first portion and electrically isolated from the plurality of first conductive interconnect structures,
wherein the first conductive interconnect structure is electrically connected to the device, and the second conductive interconnect structure is electrically connected to at least one of the metallic shields.

18. The semiconductor structure of claim 17, wherein a thickness of the second conductive interconnect structures is greater than a thickness of the first conductive interconnect structures.

19. The semiconductor structure of claim 17, further comprising at least a die pad disposed in the device and electrically connected to the first conductive interconnect structure.

20. The semiconductor structure of claim 16, further comprising a bond pad disposed over and electrically connected to the RDL.

* * * * *